US007913735B2

(12) United States Patent
Yamamoto et al.

(10) Patent No.: US 7,913,735 B2
(45) Date of Patent: Mar. 29, 2011

(54) ADHESIVE TAPE JOINING APPARATUS

(75) Inventors: Masayuki Yamamoto, Ibaraki (JP); Saburo Miyamoto, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 243 days.

(21) Appl. No.: 12/390,661

(22) Filed: Feb. 23, 2009

(65) Prior Publication Data

US 2009/0211710 A1 Aug. 27, 2009

(30) Foreign Application Priority Data

Feb. 25, 2008 (JP) ................................ 2008-043163

(51) Int. Cl.
*B29C 65/50* (2006.01)

(52) U.S. Cl. .................................... 156/379.8; 156/584

(58) Field of Classification Search .................. 156/584, 156/379.8, 344
See application file for complete search history.

(56) References Cited

U.S. PATENT DOCUMENTS

2003/0088959 A1* 5/2003 Tsujimoto .................... 29/25.01
2008/0044258 A1* 2/2008 Akechi ...................... 414/217.1
2009/0107633 A1* 4/2009 Yamaguchi et al. .......... 156/344

FOREIGN PATENT DOCUMENTS

JP 02-0028347 A 1/1990
JP 07-0014807 A 1/1995
JP 10-0233372 A 9/1998

* cited by examiner

*Primary Examiner* — Khanh Nguyen
*Assistant Examiner* — John Blades
(74) *Attorney, Agent, or Firm* — Cheng Law Group, PLLC

(57) ABSTRACT

An adhesive tape joining apparatus of this invention adopts an inverted “T”-shaped layout configured with a rectangular section that extends laterally when being viewed in a plane and a protrusion section that is coupled on a center of the rectangular section. An adhesive tape joining part is disposed in the protrusion section and joins an adhesive tape to a ring frame and a wafer. A transport mechanism is disposed in the rectangular section and transports the wafer, the ring frame, and the wafer held by the ring frame. An electronic substrate processing unit is disposed in at least one of two regions adjoining to the rectangular section with the protrusion section being interposed therebetween, and is coupled to the transport mechanism.

10 Claims, 22 Drawing Sheets

2 B 7 D C 64 12 11 8 7 10 1 f 6 A 3 4 W 9

95
96
97
98
99
100
101
W
9

ADHESIVE TAPE JOINING APPARATUS

BACKGROUND OF THE INVENTION (1) Field of the Invention

The present invention relates to an adhesive tape joining apparatus that joins a supporting adhesive tape to an electronic substrate, such as a semiconductor wafer or a printed substrate, and a ring frame to hold the electronic substrate by the ring frame.

(2) Description of the Related Art

A conventional adhesive tape joining apparatus includes a wafer supply part, a transport mechanism, an alignment stage, an ultraviolet-ray irradiation unit, a joining mechanism for joining a supporting adhesive tape to a semiconductor wafer and a ring frame, a separation unit for separating a surface-protective adhesive tape from a surface of the semiconductor wafer, and the like, for example. Herein, these constituent elements of the adhesive tape joining apparatus are integrally disposed on a base (refer to JP 02-028347 A).

Alternatively, these constituent elements are independently disposed at separate positions to execute separate processes, respectively (refer to JP 07-014807 A and JP 10-233372 A).

In the case of the former configuration, however, if any one of the constituent elements is halted due to a malfunction, the entire apparatus must be halted for maintenance. In a case where this maintenance requires many hours or a long period of time, there arises a problem of remarkable reduction in working efficiency.

On the other hand, the latter configuration is effective because maintenance can be performed for each constituent element. However, since the constituent elements are disposed separately, a transport mechanism for transporting a semiconductor wafer, a ring frame or the like must be disposed between the two constituent elements spaced away from each other. Consequently, there arises such a disadvantage that the configuration of the apparatus becomes complicated, resulting in increase of an installation area of the apparatus.

SUMMARY OF THE INVENTION

An object of the present invention is to provide an adhesive tape joining apparatus that achieves reduction in size and improves working efficiency.

In order to accomplish the object described above, the present invention adopts the following configuration:

An adhesive tape joining apparatus for joining an adhesive tape to a ring frame and an electronic substrate to hold the electronic substrate by the ring frame, the adhesive tape joining apparatus adopting an inverted "T"-shaped layout configured with a rectangular section that extends laterally when being viewed in a plane and a protrusion section that is coupled on a center of the rectangular section, the adhesive tape joining apparatus including:

an adhesive tape joining part that is disposed in the protrusion section and joins the adhesive tape to the ring frame and the electronic substrate; and a transport mechanism that is disposed on the rectangular section and transports an electronic substrate, a ring frame, and an electronic substrate held by a ring frame, wherein an electronic substrate processing unit is disposed in at least one of two regions adjoining to the rectangular section with the protrusion section being interposed therebetween, and is coupled to the transport mechanism.

According to the present invention, in the adhesive tape joining apparatus adopting the inverted "T"-shaped layout when being viewed in the plane, the adhesive tape joining part is disposed on the protrusion section and the transport mechanism is disposed on the laterally-extending rectangular section. This configuration has spaces where the transport mechanism can be coupled in the both regions adjoining to the rectangular section with the protrusion section being interposed therebetween. Accordingly, an electronic substrate processing unit that executes a process prior to the process executed by the adhesive tape joining part and an electronic substrate processing unit that executes a process subsequent to the process executed by the adhesive tape joining unit are disposed in the regions, respectively, so that the transport mechanism in a single unit can transport an electronic substrate and an electronic substrate held by a ring frame to the respective electronic substrate processing units. In other words, this configuration allows reduction in installation area of the adhesive tape joining apparatus.

Preferably, the adhesive tape joining apparatus is configured as follows.

That is, the adhesive tape joining apparatus further includes a holding table that holds an electronic substrate and a ring frame at a position in the transport mechanism, and moves between this position and a tape joining position of the adhesive tape joining part. Herein, the transport mechanism includes: an electronic substrate supply part that supplies an electronic substrate to one of the regions with the adhesive tape joining part being interposed therebetween; an aligner that performs alignment of the electronic substrate; an electronic substrate transport device that transports the electronic substrate to the electronic substrate supply part, the aligner, the electronic substrate processing unit disposed in the region adjoining to the rectangular section and coupled to the transport mechanism, and the holding table; a ring frame supply part that supplies a ring frame to the other region; an aligner that performs alignment of the ring frame; a storage part that houses the electronic substrate held by the ring frame; and a ring frame transport device that transports the ring frame to the ring frame supply part, the aligner, the holding table, the electronic substrate processing unit disposed in the region adjoining to the rectangular section and coupled to the transport mechanism, and the storage part.

With this configuration, the adhesive tape joining part and the transport mechanism can transport/receive a ring frame and an electronic substrate to/from each other. That is, the adhesive tape joining apparatus adopting the inverted "T"-shaped layout when being viewed in the plane can be configured in a minimum unit to execute a process of supplying an electronic substrate and a ring frame, a process of laminating the electronic substrate on the ring frame, and a process of collecting the electronic substrate and the ring frame in sequence.

Alternatively, the adhesive tape joining apparatus may be configured as follows.

For example, the electronic substrate has a surface to which a protective adhesive tape is joined, and the electronic substrate processing unit disposed in the region near the ring frame supply part is a tape separation unit that separates the protective adhesive tape from the surface of the electronic substrate held by the ring frame.

With this configuration, the electronic substrate having the surface to which the protective adhesive tape is joined is held by the ring frame, and then the adhesive tape is separated from the electronic substrate. Accordingly, in a case where the electronic substrate is a semiconductor wafer, the semiconductor wafer is effectively transported to a subsequent process, that is, a dicing process.

Alternatively, the electronic substrate has a surface to which a protective adhesive tape of an ultraviolet curable type is joined, and the electronic substrate processing unit disposed in the region near the electronic substrate supply part is an ultraviolet-ray irradiation unit that irradiates the adhesive tape joined to the electronic substrate with ultraviolet rays.

With this configuration, when the protective adhesive tape joined to the electronic substrate is irradiated with the ultraviolet rays, an adhesion layer of the adhesive tape is cured. Thus, the adhesive tape can be readily separated from the electronic substrate.

Still alternatively, the electronic substrate is laminated on a support substrate through a double-coated adhesive tape with a base material therof being sandwiched by different adhesion layers.

With this configuration, in a case where the electronic substrate is a thin semiconductor wafer having a back face subjected to back grinding, a support substrate is laminated on the semiconductor wafer. Therefore, the semiconductor wafer which is enhanced in rigidity can be held by a ring frame. Accordingly, an adhesive tape can be joined to the semiconductor wafer with good accuracy, with no warp in the semiconductor wafer.

Yet alternatively, at least one of the first adhesion layer and the second adhesion layer of the double-coated adhesive tape is of an ultraviolet curable type, and the electronic substrate processing unit disposed in the region near the electronic substrate supply part is an ultraviolet-ray irradiation unit that irradiates the double-coated adhesive tape with ultraviolet rays.

With this configuration, the ultraviolet curable-type adhesion layer of the adhesive tape is cured. Thus, the adhesive tape can be readily separated from one of the electronic substrate and the support substrate.

Yet alternatively, the electronic substrate processing unit disposed in the region near the ring frame supply part is a substrate separation unit that separates the support substrate from the electronic substrate and collects the support substrate.

With this configuration, the single adhesive tape joining apparatus, to which the electronic substrate processing unit is coupled, can efficiently execute a series of processes from joining of an adhesive tape to an electronic substrate to separation of a support substrate from the electronic substrate.

Yet alternatively, the adhesive tape joining apparatus further includes a tape separation unit that is coupled to the substrate separation unit and separates the double-coated adhesive tape, which is left on one of the electronic substrate and the support substrate.

With this configuration, the double-coated adhesive tape can be separated from one of the support substrate and the electronic substrate. Therefore, the support substrate, from which the double-coated adhesive tape is separated, can be used again.

Preferably, the adhesive tape joining part and the transport mechanism form a base unit, the base unit and each electronic substrate processing unit coupled to the base unit include control parts, respectively, so as to act the units independently of one another, and when each electronic substrate processing unit is coupled to the base unit, the control part of the base unit is electrically connected to the control part of each electronic substrate processing unit to control the entire apparatus.

With this configuration, the adhesive tape joining apparatus can be used in such a manner that various electronic substrate processing units are coupled to the base unit. Even when at least one of the units requires maintenance due to a malfunction, the remaining units can be actuated independently of one another.

Preferably, the adhesive tape joining part disposed in the protrusion section and the transport mechanism disposed in the rectangular section can be separated from each other.

With this configuration, upon exchange of a roll of an adhesive tape with new one in the adhesive tape joining part, a user does not necessarily to conduct the exchange above the transport mechanism. That is, the transport mechanism can be prevented from being contaminated by dust generated in the exchange.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

With reference to the drawings, hereinafter, description will be given of preferred embodiments of the present invention.

(Basic Configuration)

Figure 1:
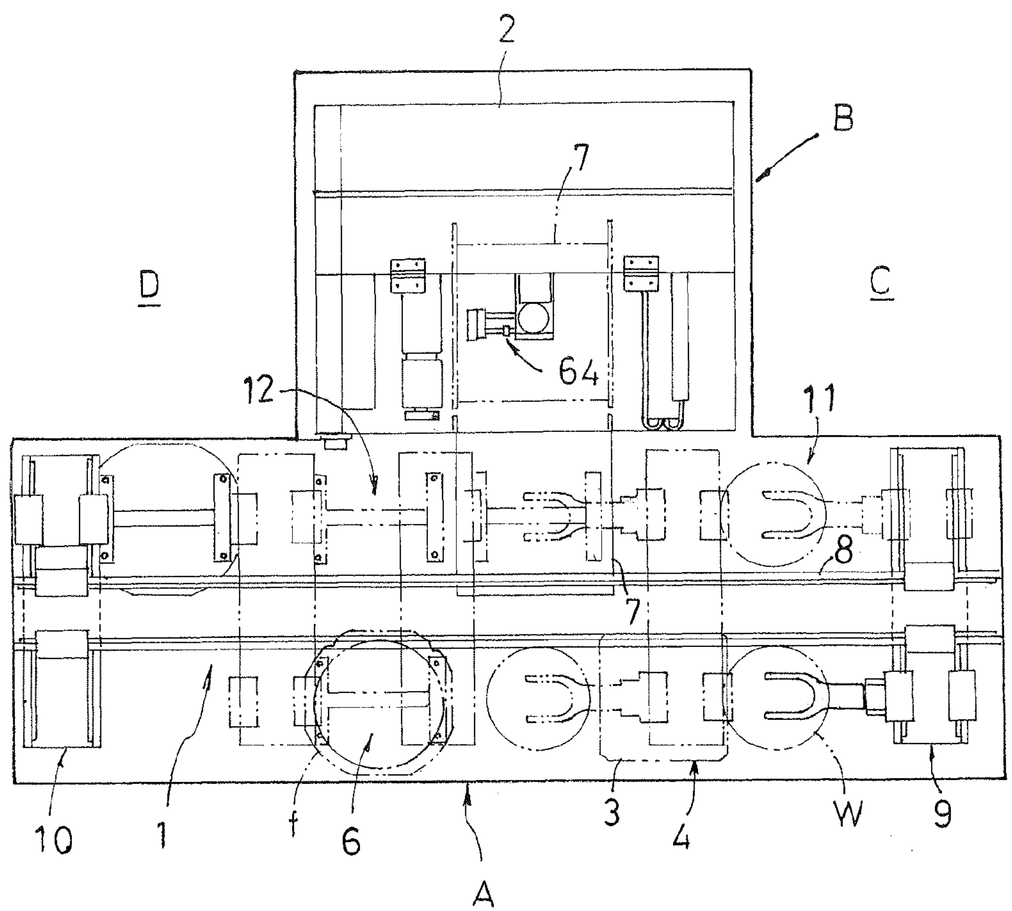
FIG. 1 is a plan view showing a basic configuration of an adhesive tape joining apparatus.
Figure 2:
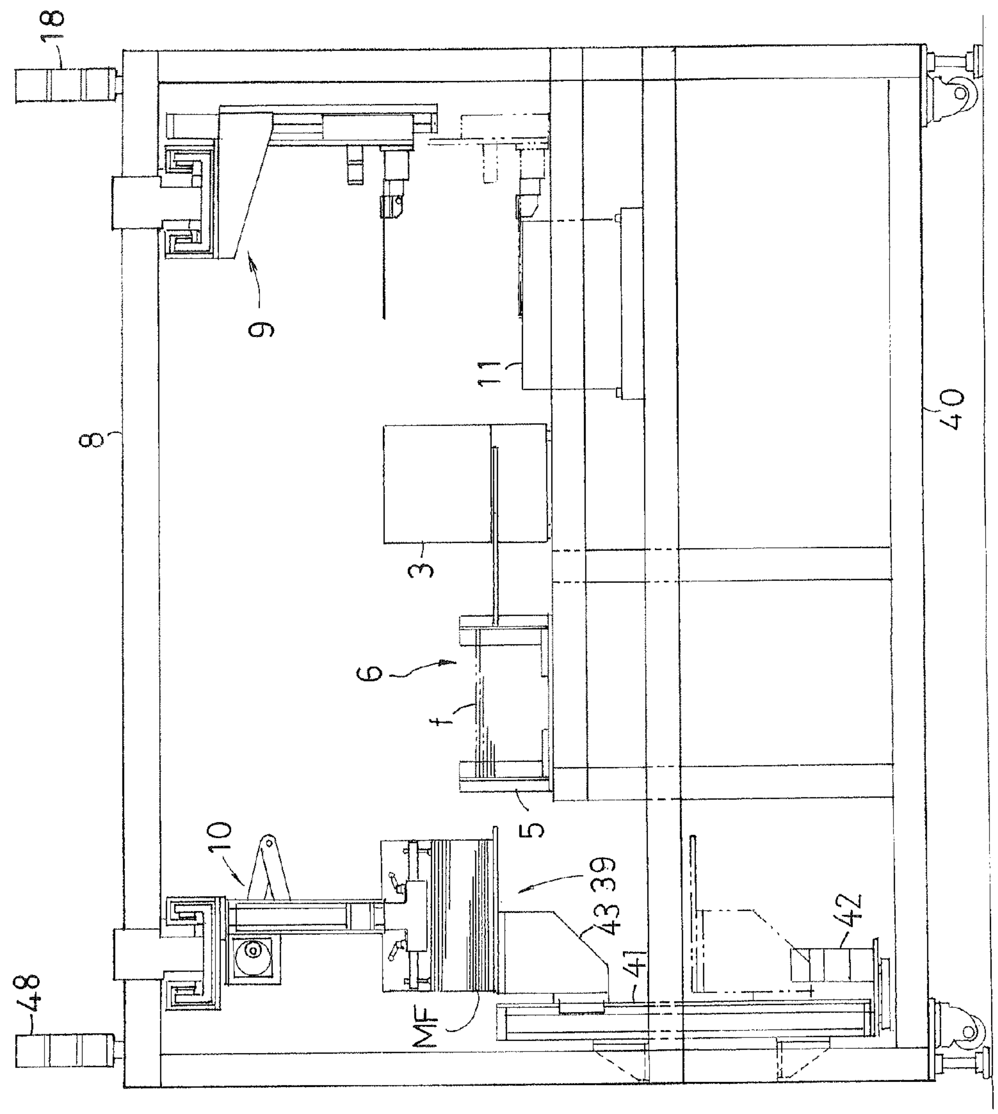
FIG. 2 is a front view showing the adhesive tape joining apparatus.

FIG. 1 is a plan view showing a basic configuration of an adhesive tape joining apparatus according to the present invention. FIG. 2 is a front view showing this basic configuration.

Figure 23:
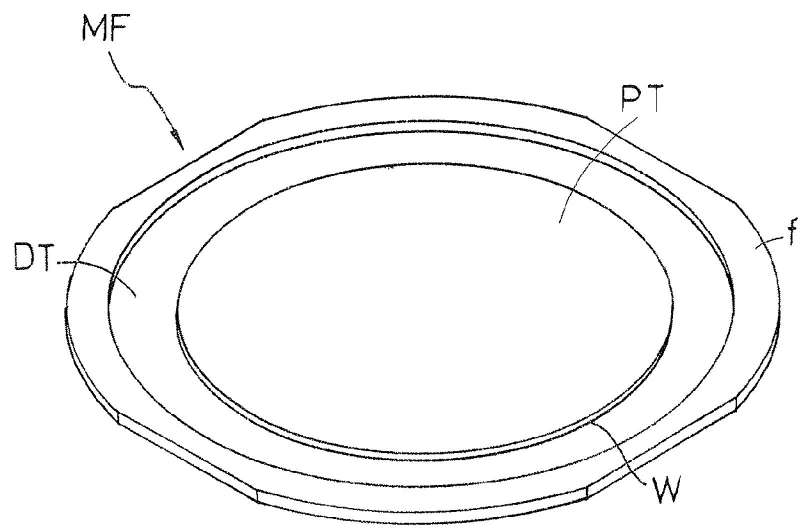
FIG. 23 is a perspective view showing a mount frame.

As shown in FIG. 23, the adhesive tape joining apparatus joins an adhesive tape DT to a semiconductor wafer W (hereinafter, simply referred to as a "wafer W"), which is one example of an electronic substrate having a surface to which a protective adhesive tape PT (hereinafter, simply referred to as a "protective tape PT") is joined, and a ring frame f to fabricate a mount frame MF. As shown in FIG. 1, the adhesive tape joining apparatus is configured with a laterally-extending rectangular section A and a protrusion section B coupled on a center of the rectangular section A so as to protrude rearward from the center. That is, the adhesive tape joining apparatus is configured as a base unit arranged in an inverted "T" shape. In the following description, a longitudinal direction of the rectangular section A is defined as a left-to-right direction. Moreover, a horizontal direction orthogonal to the rectangular section A is defined as a front-to-rear direction (an up-to-down direction in FIG. 1).

A transport mechanism 1 is disposed on the rectangular section A. Herein, the transport mechanism 1 transports a wafer W, a ring frame f and a mount frame MF. On the other hand, an adhesive tape joining part 2 is disposed on the protrusion section B. Herein, the adhesive tape joining part 2 joins an adhesive tape DT to a ring frame f and a wafer W to fabricate a mount frame MF.

As shown in FIGS. 1 and 2, an electronic substrate supply part 4 is disposed on the rectangular section A at a rightward front side with respect to the center of the rectangular section A. The electronic substrate supply part 4 includes a cassette 3 that houses a plurality of wafers W in a stack manner, and supplies each wafer W. Moreover, a ring frame supply part 6 is disposed on the rectangular section A at a leftward front side with respect to the center of the rectangular section A. The ring frame supply part 6 includes a cassette 5 that houses a plurality of ring frames f in a stack manner, and supplies each ring frame f. Further, a holding table 7 is disposed on the rectangular section A at a rear side near the center of the rectangular section A (near the adhesive tape joining part 2) so as to move in the front-to-rear direction. Herein, the holding table 7 transfers a wafer W and a ring frame f each placed thereon to the adhesive tape joining part 2. It is to be noted that the electronic substrate supply part 4 corresponds to an electronic substrate supply part according to the present invention.

The transport mechanism 1 includes an electronic substrate transport device 9 and a ring frame transport device 10. The electronic substrate transport device 9 is supported at a right side of a guide rail 8 so as to move in the left-to-right direction. Herein, the guide rail 8 is provided horizontally at an upper side of the rectangular section A so as to extend in the left-to-right direction. On the other hand, the ring frame transport device 10 is supported at a left side of the guide rail 8 so as to move in the left-to-right direction. Moreover, an aligner 11 is provided at a rightward rear side of the rectangular section A. Herein, the aligner 11 performs alignment of a wafer W, based on a notch or an orientation flat. Further, an aligner 12 is provided at a rear side of the ring frame supply part 6, and performs alignment of a ring frame f.

The electronic substrate transport device 9 pulls out a wafer W from the cassette 3, and then transports the wafer W in the left-to-right direction and the front-to-rear direction. Further, the electronic substrate transport device 9 can turn the wafer W upside down. FIGS. 3 to 9 show a detailed structure of the electronic substrate transport device 9.

Figure 3:
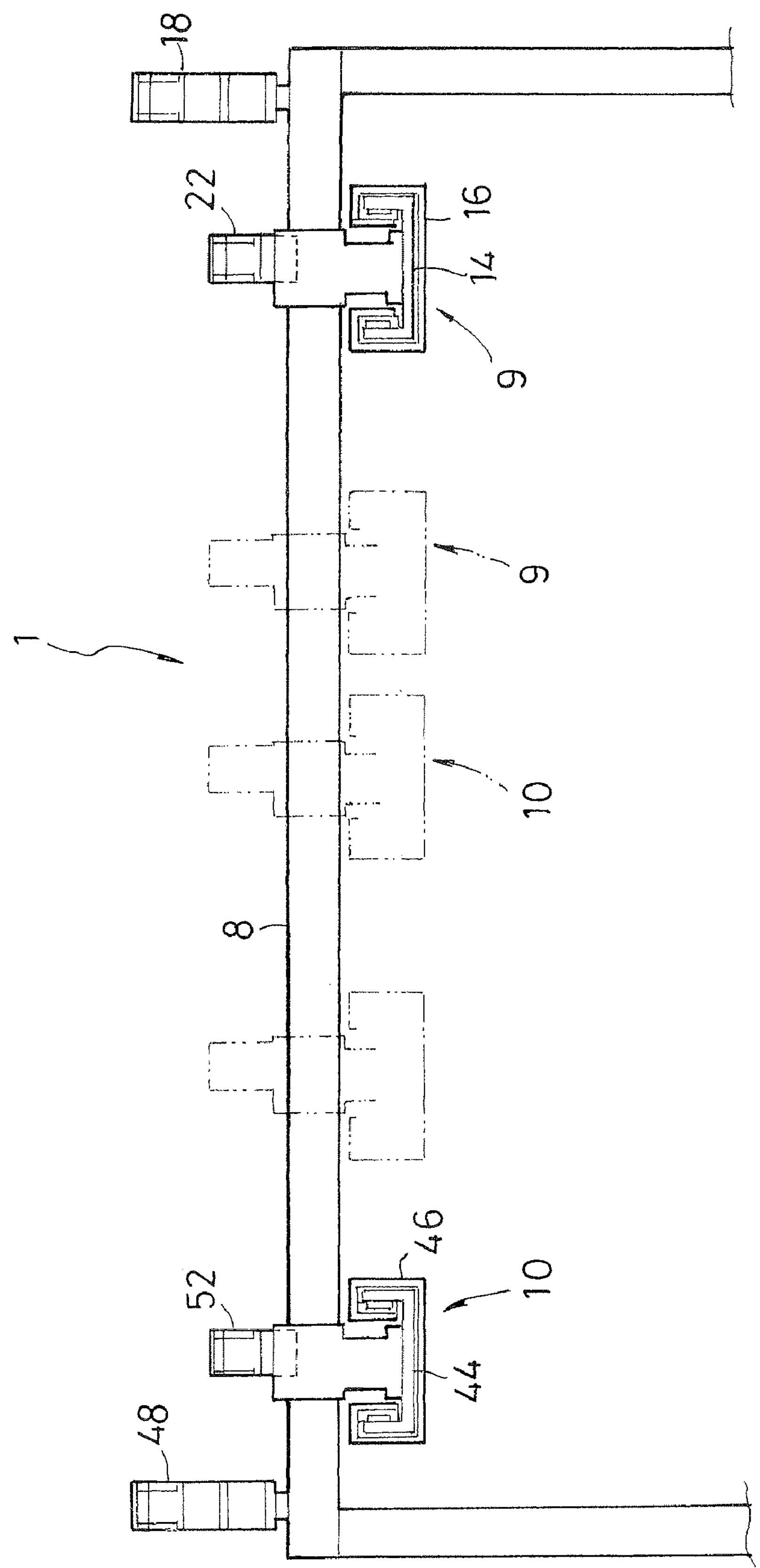
FIG. 3 is a front view partly showing a transport mechanism.
Figure 5:
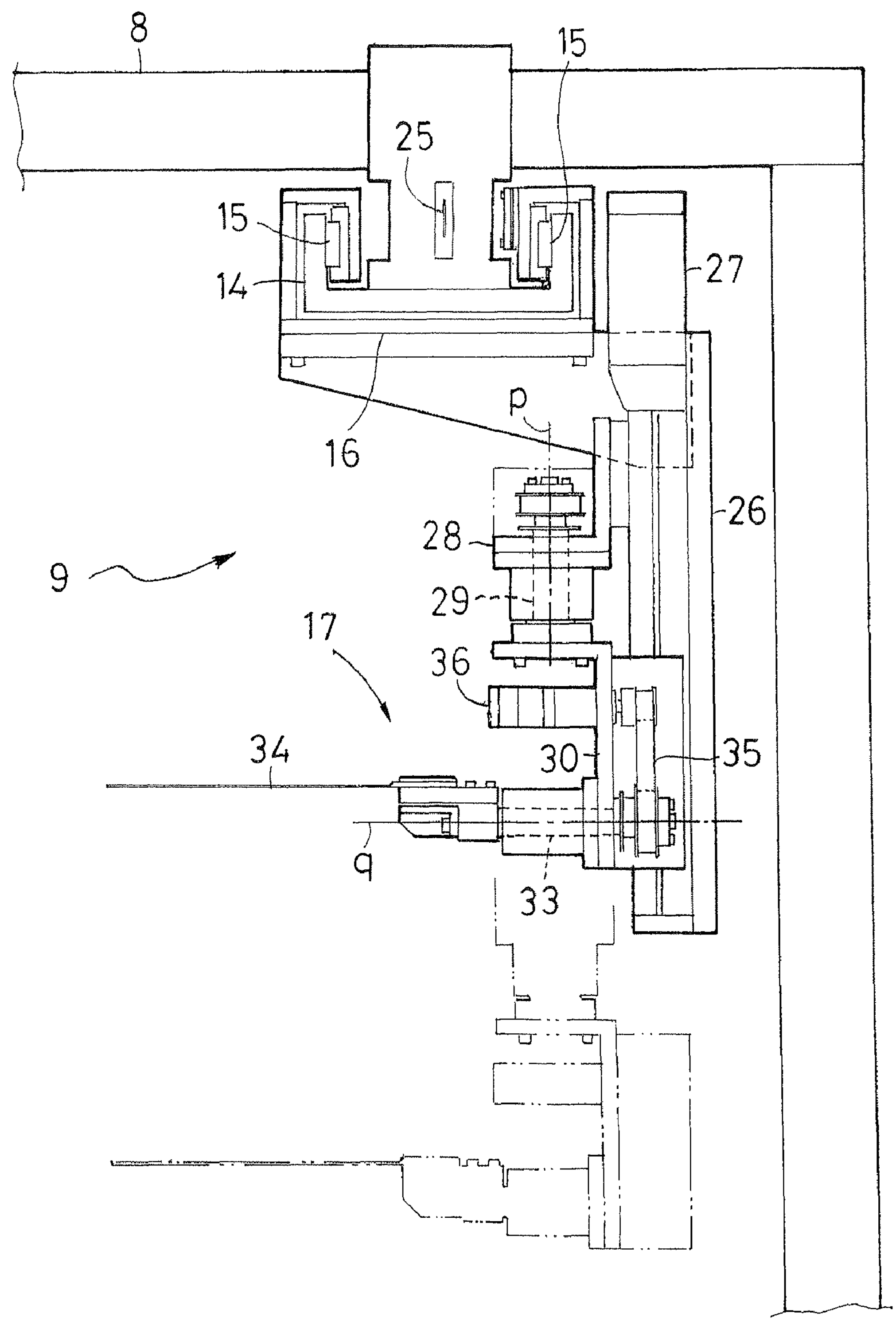
FIG. 5 is a front view showing an electronic substrate transport device.

As shown in FIGS. 3 and 5, the electronic substrate transport device 9 includes a left-to-right direction movable board 14 that extends in the front-to-rear direction and moves in the left-to-right direction along the guide rail 8. The electronic substrate transport device 9 also includes a front-to-rear direction movable board 16 that moves in the front-to-rear direction along a guide rail 15 of the left-to-right direction movable board 14. The electronic substrate transport device 9 also includes an electronic substrate holding unit 17 that is provided below the front-to-rear movable board 16 so as to move vertically.

Figure 4:
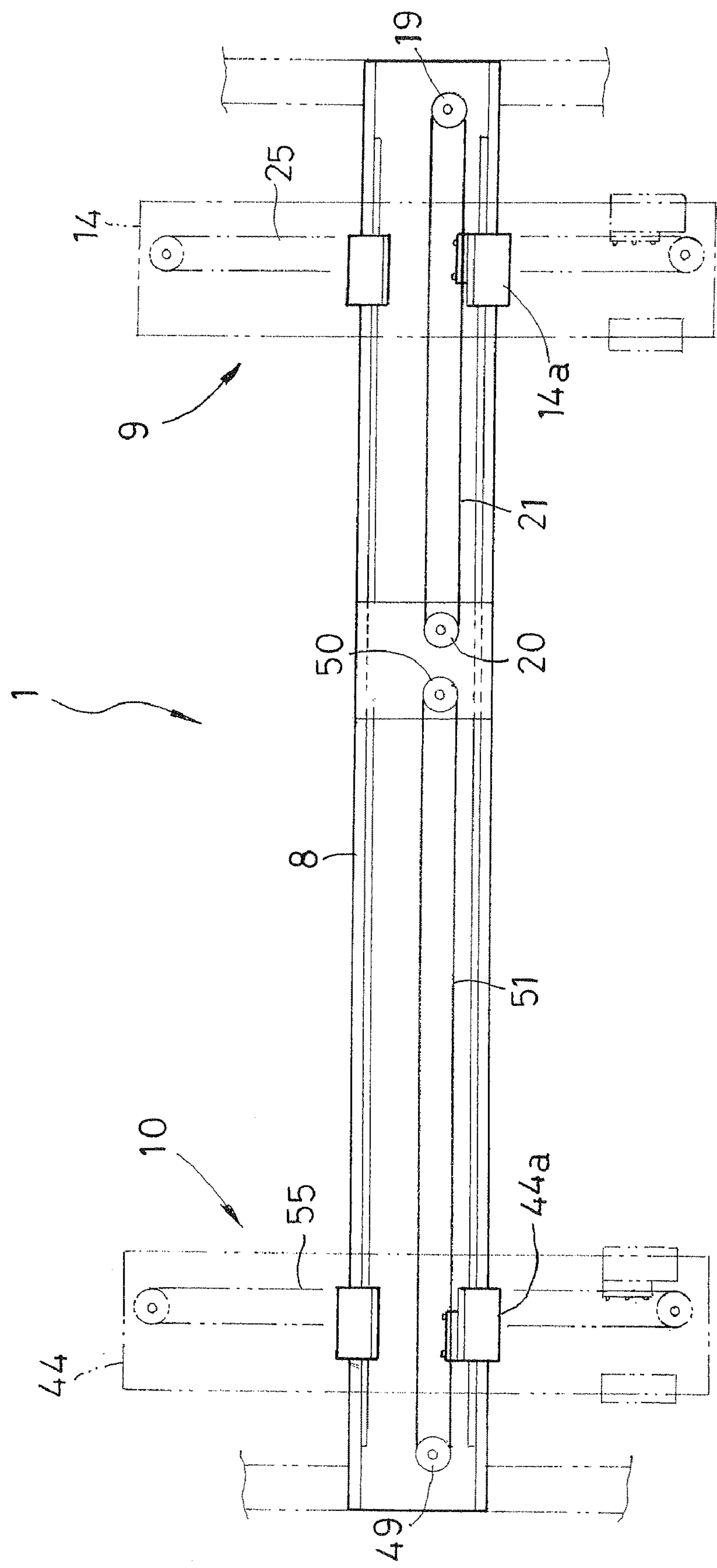
FIG. 4 is a plan view partly showing the transport mechanism.

As shown in FIGS. 3 and 4, a driving pulley 19 is pivotally supported at a position near a right end of the guide rail 8 and is driven by a motor 18 so as to rotate forward/backward. Moreover, an idling pulley 20 is pivotally supported at a position near a center of the guide rail 8. Further, a belt 21 is wound between the driving pulley 19 and the idling pulley 20, and a slide engagement part 14*a* of the left-to-right direction movable board 14 is coupled to the belt 21. When the belt 21 is rotationally moved forward/backward, the left-to-right direction movable board 14 moves in the left-to-right direction.

Figure 7:
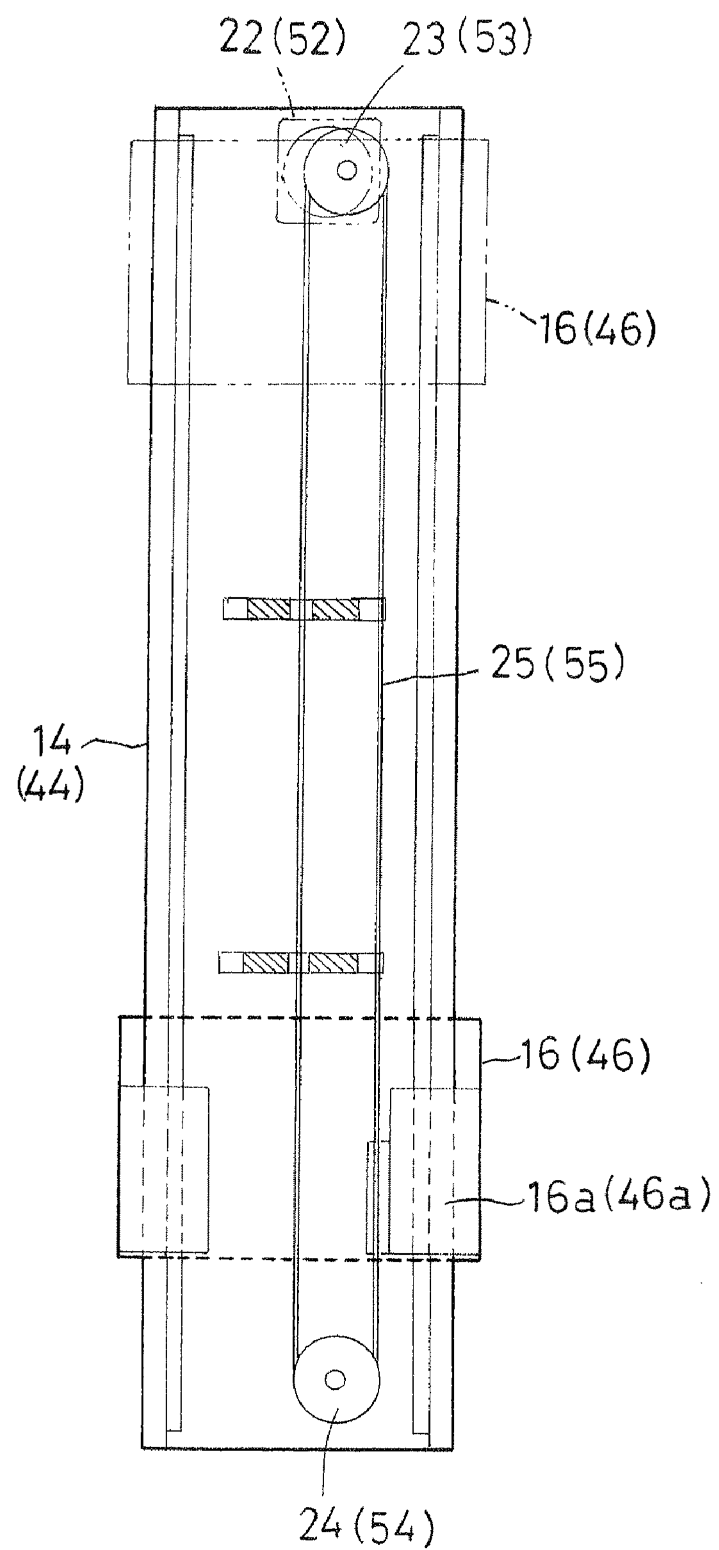
FIG. 7 is a plan view showing a front-to-rear movement structure of the electronic substrate transport device (or a ring frame transport device)
Figure 8:
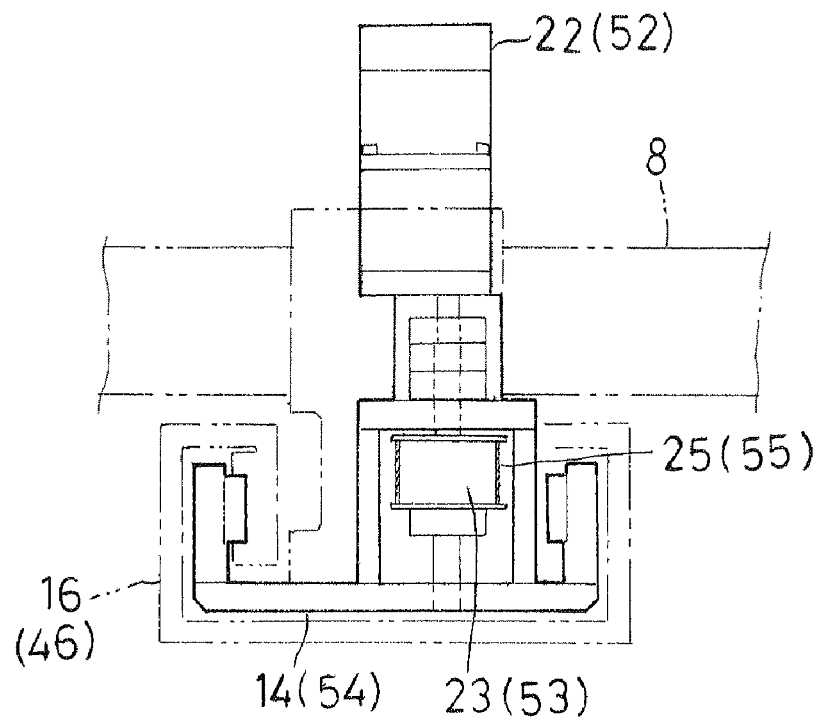
FIGS. 8 and 9 are front views each partly showing the front-to-rear movement structure of the electronic substrate transport device (or the ring frame transport device)
Figure 9:
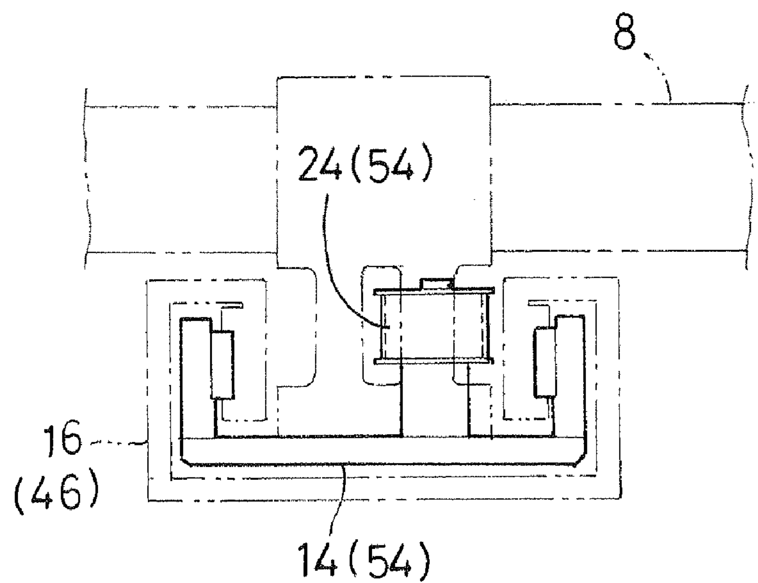

As shown in FIGS. 7 to 9, a driving pulley 23 is pivotally supported at a position near a rear end of the left-to-right direction movable board 14 and is driven by a motor 22 so as to rotate forward/backward. Moreover, an idling pulley 24 is pivotally supported at a position near a front end of the left-to-right direction movable board 14. Further, a belt 25 is wound between the driving pulley 23 and the idling pulley 24, and a slide engagement part 16*a* of the front-to-rear direction movable board 16 is coupled to the belt 25. When the belt 25 is rotationally moved forward/backward, the front-to-rear direction movable board 16 moves in the front-to-rear direction.

Figure 6:
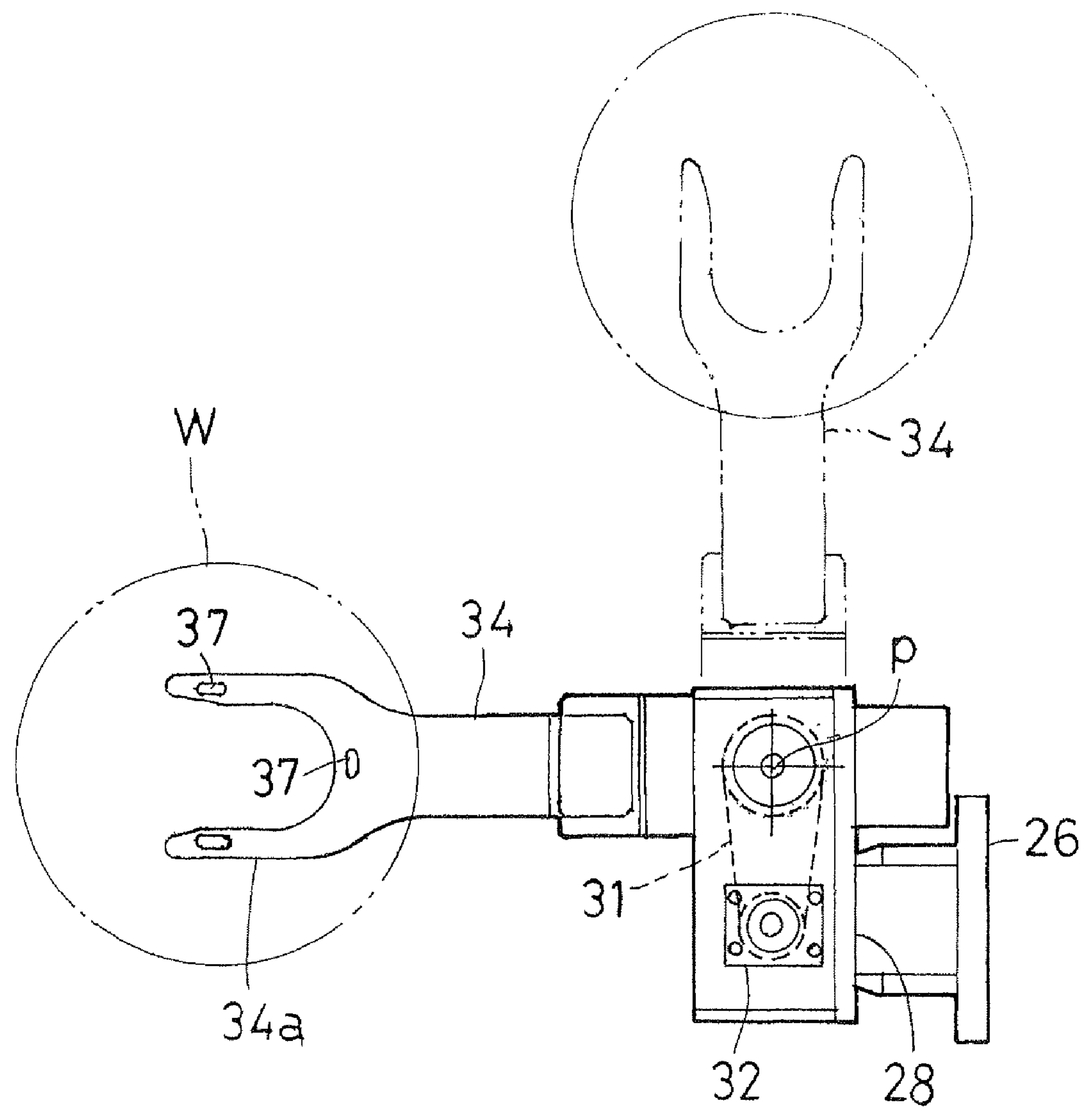
FIG. 6 is a plan view showing main components of the electronic substrate transport device.

As shown in FIGS. 5 and 6, the electronic substrate holding unit 17 includes an inverted "L"-shaped support frame 26, an ascent/descent board 28, a rotation board 30, a rotating motor 32, an electronic substrate holding arm 34, an inverting motor 36 and the like. Herein, the support frame 26 is coupled to a lower side of the front-to-rear direction movable board 16. The ascent/descent board 28 is driven by a motor 27 so as to move vertically in a screw feed manner along an upright frame part of the support frame 26. The rotation board 30 is pivotally supported by the ascent/descent board 28 through a rotation shaft 29 so as to rotate about a vertically-oriented axis p. The rotating motor 32 is interlocked with the rotation shaft 29 through a belt 31 wound between the rotating motor 32 and the rotation shaft 29. The electronic substrate holding arm 34 is pivotally supported at a lower side of the rotation board 30 through a rotation shaft 33 so as to rotate backward about a horizontally-oriented axis q. The inverting motor 36 is interlocked with the rotation shaft 33 through a belt 35 wound between the inverting motor 36 and the rotation shaft 33.

As shown in FIG. 6, a "U"-shaped suction part 34*a* having vacuum suction holes 37 is formed at a tip end side of the electronic substrate holding arm 34. Use of the movable structure described above brings about the following advantages.

That is, a wafer W, which is suction-held by the electronic substrate holding arm 34, can be moved in the front-to-rear direction, can be moved in the left-to-right direction and can be turned about the vertically-oriented axis p. As shown in FIG. 5, further, the wafer W can be turned upside down by the backward rotation about the horizontally-oriented axis q.

As shown in FIG. 2, a storage part 39 is disposed at a left side of the ring frame supply part 6. Herein, the storage part 39 collects to stack a mount frame MF, which is fabricated by joining an adhesive tape DT to a ring frame f and a wafer W such that the ring frame f holds the wafer W. The storage part 39 includes an upright rail 41 coupled to and fixed on an apparatus framework 40, and an ascent/descent board 43 driven by a motor 42 so as to move vertically in a screw feed manner along the upright rail 41. Accordingly, the ring frame supply part 6 allows a mount frame MF placed on the ascent/descent board 43 to move downward in a pitch feed manner.

The ring frame transport device 10 pulls out an uppermost one of stacked ring frames f from the ring frame supply part 6 in succession, and then transports each ring frame f in the left-to-right direction and the front-to-rear direction. A left-to-right movement structure and a front-to-rear movement structure of the ring frame transport device 10 are similar to those of the electronic substrate transport device 9.

Figure 10:
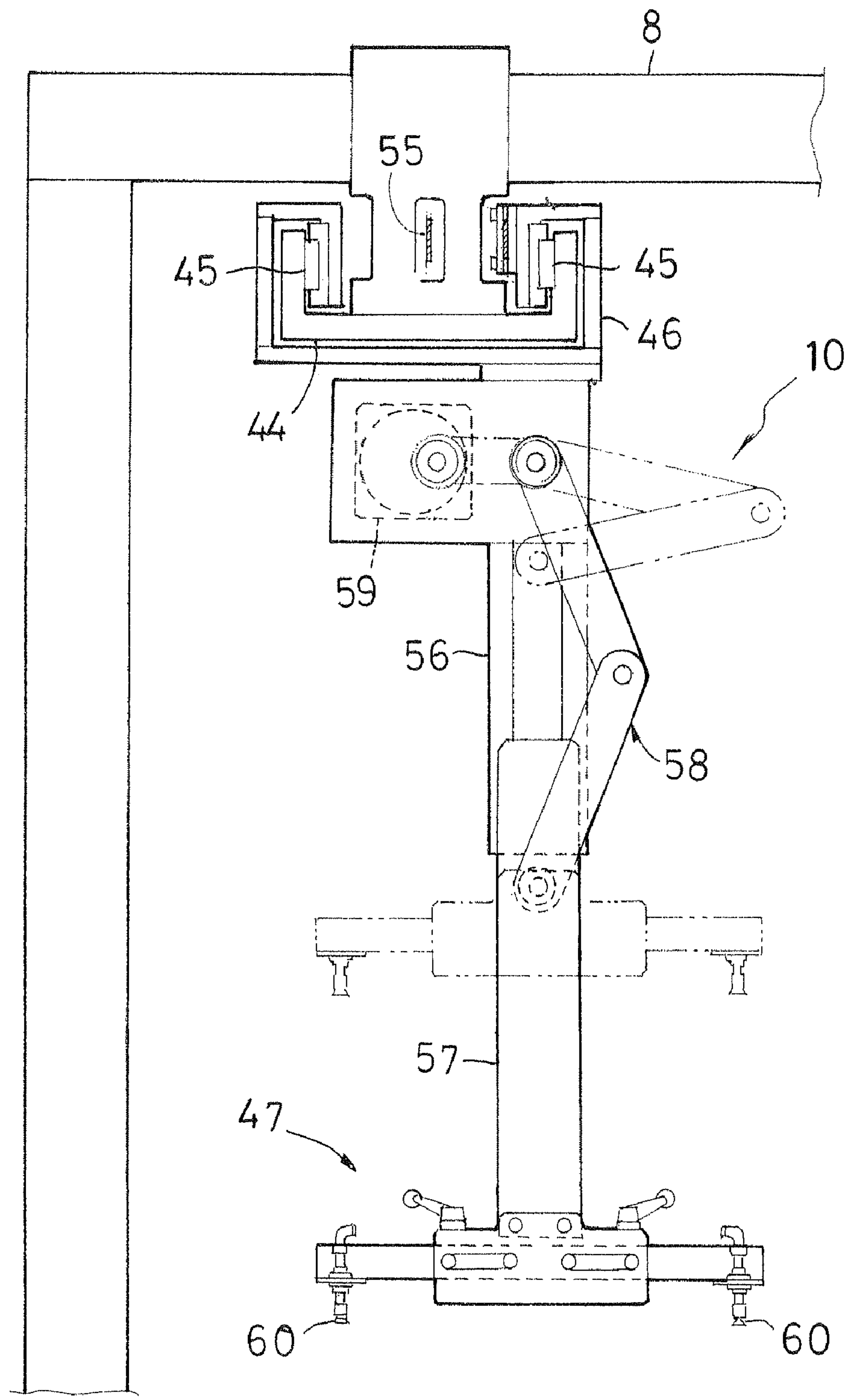
FIG. 10 is a front view showing the ring frame transport device.

As shown in FIGS. 7 and 10, specifically, the ring frame transport device 10 includes a left-to-right direction movable board 44 that extends in the front-to-rear direction and moves in the left-to-right direction along the guide rail 8. The ring frame transport device 10 also includes a front-to-rear direction movable board 46 that moves in the front-to-rear direction along a guide rail 45 of the left-to-right direction movable board 44. The ring frame transport device 10 also includes a ring frame holding unit 47 that is provided below the front-to-rear direction movable board 46 so as to move vertically.

As shown in FIGS. 3 and 4, a driving pulley 49 is pivotally supported at a position near a left end of the guide rail 8 and is driven by a motor 48 so as to rotate forward/backward. Moreover, an idling pulley 50 is pivotally supported at a position near the center of the guide rail 8. Further, a belt 51 is wound between the driving pulley 49 and the idling pulley 50, and a slide engagement part **44*a* of the left-to-right direction movable board 44 is coupled to the belt 51. Accordingly, when the belt 51 is rotationally moved forward/backward, the left-to-right direction movable board 44** moves in the left-to-right direction.

Herein, the configuration shown in FIGS. 7 to 9, which is used for describing the electronic substrate transport device 9, is applied for describing the ring frame transport device 10. That is, a driving pulley 53 is pivotally supported at a position near a rear end of the left-to-right direction movable board 44 and is driven by a motor 52 so as to rotate forward/backward. Moreover, an idling pulley 54 is pivotally supported at a position near the rear end of the left-to-right direction movable board 44. Further, a belt 55 is wound between the driving pulley 53 and the idling pulley 54, and a slide engagement part **46*a* of the front-to-rear direction movable board 46 is coupled to the belt 55. Accordingly, when the belt 55 is rotationally moved forward/backward, the front-to-rear direction movable board 46** moves in the front-to-rear direction.

As shown in FIG. 10, the ring frame holding unit 47 includes an upright frame 56 that is coupled on a bottom side of the front-to-rear direction movable board 46, an ascent/descent frame 57 that is supported so as to slide vertically along the upright frame 56, a bendable link mechanism 58 that allows the ascent/descent frame 57 to move vertically, a motor 59 that allows the bendable link mechanism 58 to bend forward/backward, a plurality of suction pads 60 that are provided at corners of a bottom side of the ascent/descent frame 57, and the like. Accordingly, each suction pad 60 suction-holds an uppermost one of stacked ring frames f stacked on the ascent/descent board 43, and then moves upward. Thus, the ring frame transport device 10 can transport a ring frame f in the left-to-right direction and the front-to-rear direction. Herein, a position of each suction pad 60 can be adjusted horizontally in accordance with a size of a ring frame f.

The transport mechanism 1 is configured as described above. A wafer W and a ring frame f are transported to the adhesive tape joining part 2 as follows.

In the electronic substrate transport device 9, first, the electronic substrate holding arm 34 suction-holds a wafer W and transports the wafer W to the aligner 11. Next, the aligner 11 performs alignment of the wafer W placed thereon. Next, the electronic substrate holding arm 34 suction-holds the wafer W subjected to the alignment again, turns the wafer W upside down, transfers the wafer W to the holding table 7, and places the wafer W on the holding table 7 in a state that a surface, to which a protective tape PT is joined, of the wafer W is directed downward.

In the ring frame transport device 10, on the other hand, each suction pad 60 suction-holds a ring frame f and transports the ring frame f to the aligner 12. Next, the aligner 12 performs alignment of the ring frame f placed thereon. Next, each suction pad 60 suction-holds the ring frame f subjected to the alignment again, transfers the ring frame f to the holding table 7, and places the ring frame f on the holding table 7 such that the ring frame f is concentric with the wafer W.

Figure 11:
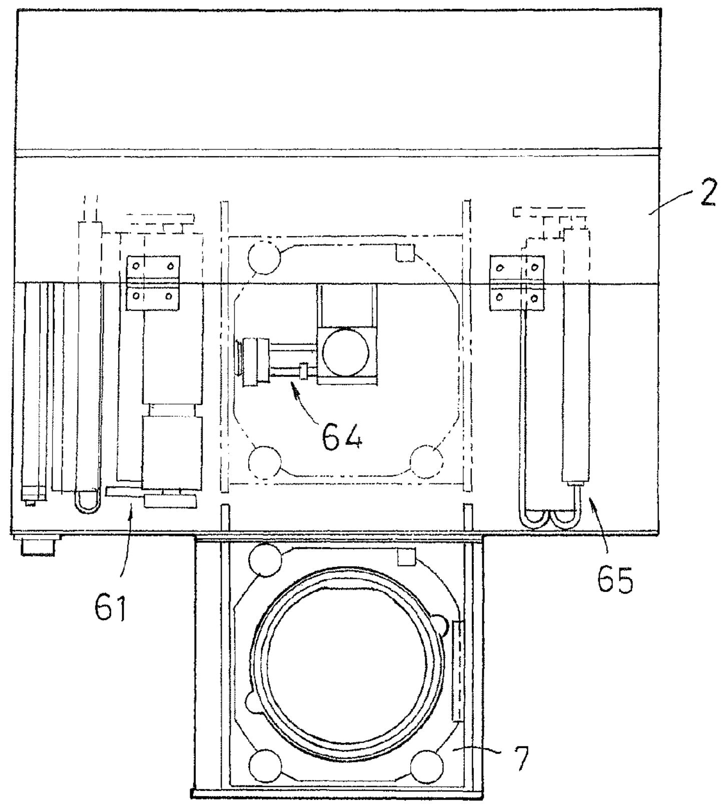
FIG. 11 is a plan view showing an adhesive tape joining part.
Figure 12:
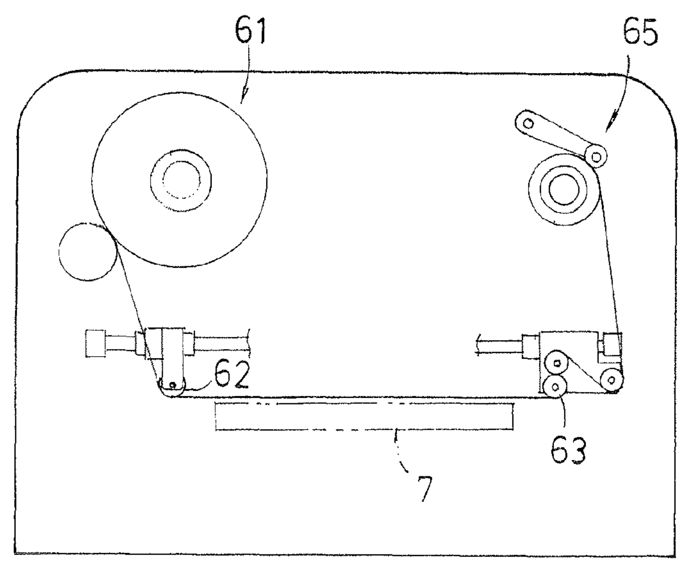
FIG. 12 is a front view showing the adhesive tape joining part.

As shown in FIGS. 11 and 12, the adhesive tape joining part 2 includes a tape supply part 61 that houses a wide adhesive tape (a dicing tape) DT in a roll form, a joining roller 62, a separation roller 63, a tape cutting mechanism 64, a tape collection part 65, and the like. That is, when the holding table 7, on which the wafer W having a back side directed upward and the ring frame f are placed, arrives at a tape joining position, the joining roller 62 moves from right to left in FIG. 12. Thus, the adhesive tape DT is joined onto wafer W and the ring frame f. Next, in a state that the tape cutting mechanism 64 moves downward, a disc-shaped blade (not shown) turns around the ring frame f to cut the adhesive tape DT joined to the ring frame f along the ring frame f. Next, the separation roller 63 moves from right to left in FIG. 12 to separate an unnecessary portion of the cut adhesive tape DT, which corresponds to a portion located outside a cutting line, from the ring frame f. Next, the tape collection part 65 reels and collects the separated unnecessary tape.

In the basic configuration shown in FIG. 1, various electronic substrate processing units are provided in two regions C and D each adjoining to the rectangular section A with the protrusion section B being interposed therebetween so as to be coupled to the base unit, respectively. Thus, the adhesive tape joining apparatus is allowed to have various configurations. Hereinafter, description will be given of some embodiments of such an adhesive tape joining apparatus.

First Embodiment

Figure 13:
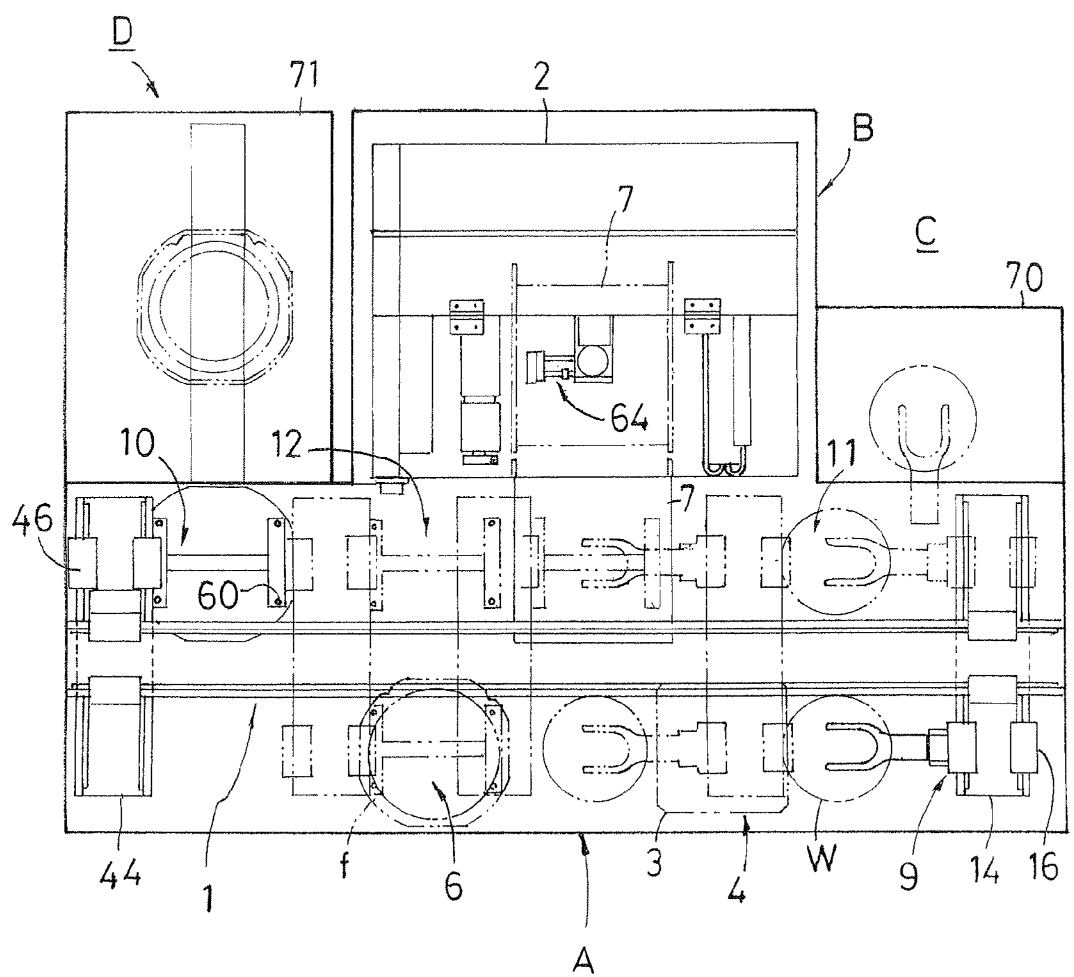
FIG. 13 is a plan view showing a first embodiment of the adhesive tape joining apparatus.

FIG. 13 is a plan view showing a first embodiment of the adhesive tape joining apparatus. In this embodiment, an ultraviolet-ray irradiation unit 70 is disposed in the region C located at the right side of the protrusion section B, and a tape separation unit 71 is disposed on the region D located at the left side of the protrusion section B.

That is, the two units 70 and 71 are coupled to the base unit.

Herein, a protective tape PT to be joined to a surface of a wafer W is of an ultraviolet curable type. The wafer W is pulled out from the electronic substrate supply part 4 in a state that the surface thereof, to which the protective tape PT is joined, is directed upward. Then, the wafer W is transferred to the ultraviolet-ray irradiation unit 70 and is irradiated with ultraviolet rays. As a result, the protective tape PT is reduced in adhesion. Thereafter, the wafer W irradiated with the ultraviolet rays is subjected to alignment with the aligner 11 and then is placed on the holding table 7 in a state that an orientation thereof is inverted. Next, the wafer W is transferred to the tape joining position of the adhesive tape joining part 2, together with a ring frame f transferred by the ring frame transport device 10. Herein, the adhesive tape joining part 2 joins an adhesive tape DT to the ring frame f and the wafer W to fabricate a mount frame MF having a top side to which the adhesive tape DT is joined. Herein, the top side of the mount frame MF is directed downward.

After completion of the tape joining process in the adhesive tape joining part 2, the holding table 7 returns to its original position. At this position, the ring frame transport device 10 receives the mount frame MF from the holding table 7, and transports the mount frame MF to a forward position of the tape separation unit 71.

Figure 15:
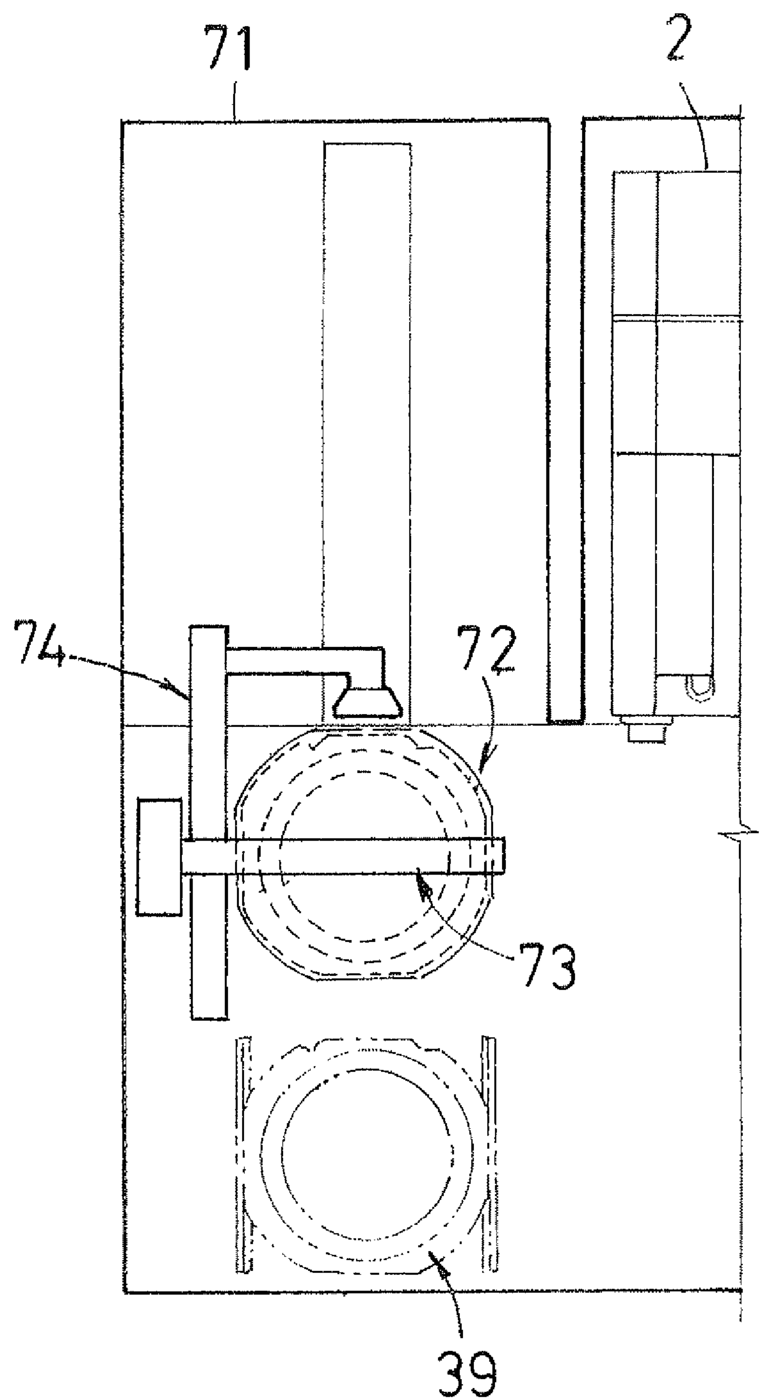
FIG. 15 is a plan view showing a position near a front side of the tape separation unit.

As shown in FIG. 15, a mount frame transport device 72, an inversion unit 73 and a conveyance device 74 are disposed at the forward position of the tape separation unit 71. Herein, the mount frame transport device 72 receives a mount frame MF having a top side directed downward from the holding table 7, the inversion unit 73 inverts the mount frame MF such that the top side of the mount frame MF is directed upward, and the conveyance device 74 supplies the mount frame MF into the storage part 39.

Figure 14:
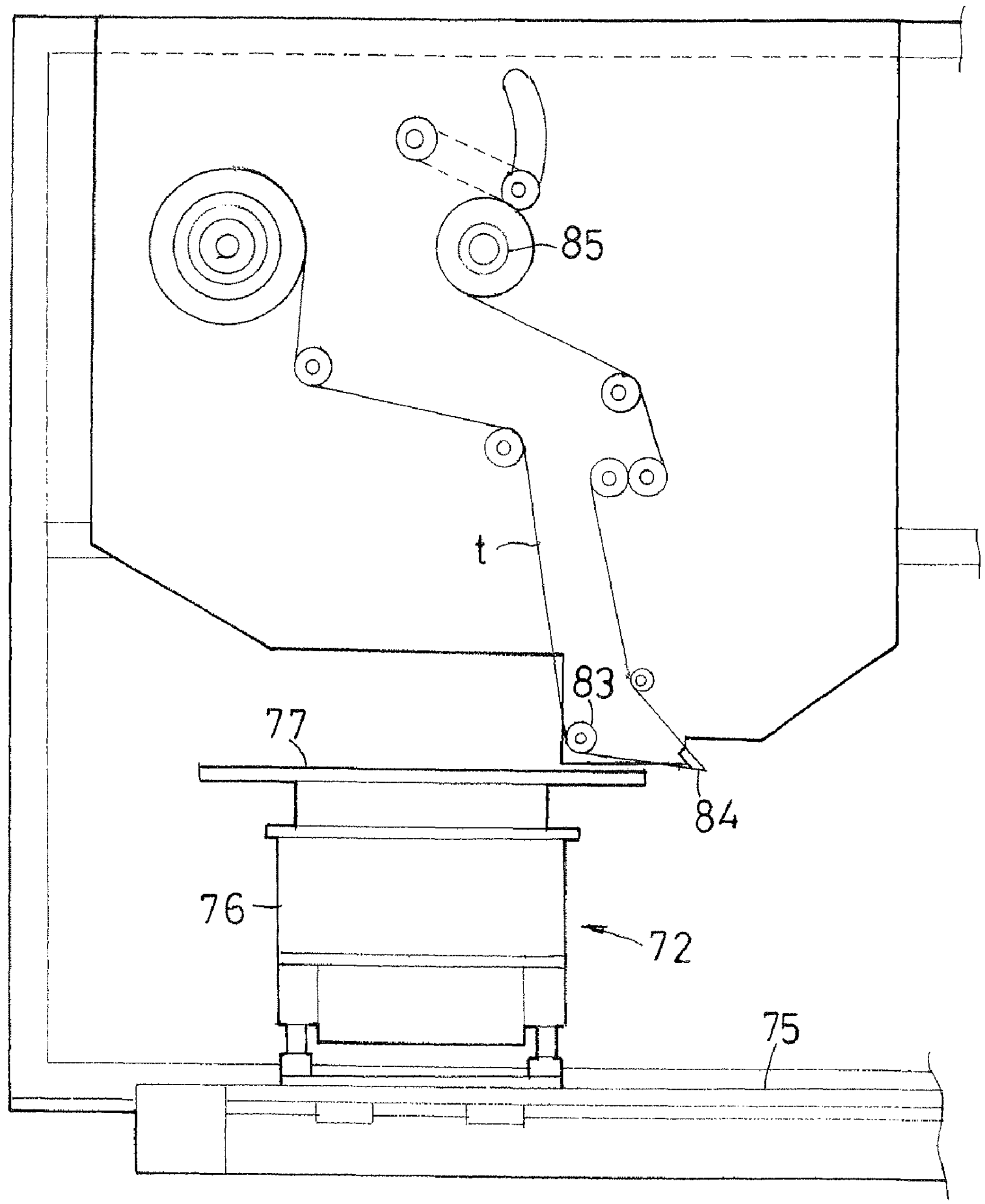
FIG. 14 is a side view showing a tape separation unit and a mount frame transport device.

As shown in FIG. 14, the mount frame transport device 72 has the following configuration. That is, a movable board 76 is supported so as to move in the front-to-rear direction along a guide rail 75, and a mount frame holding table 77 is disposed on the movable board 76 so as to rotate and move vertically.

Figure 16:
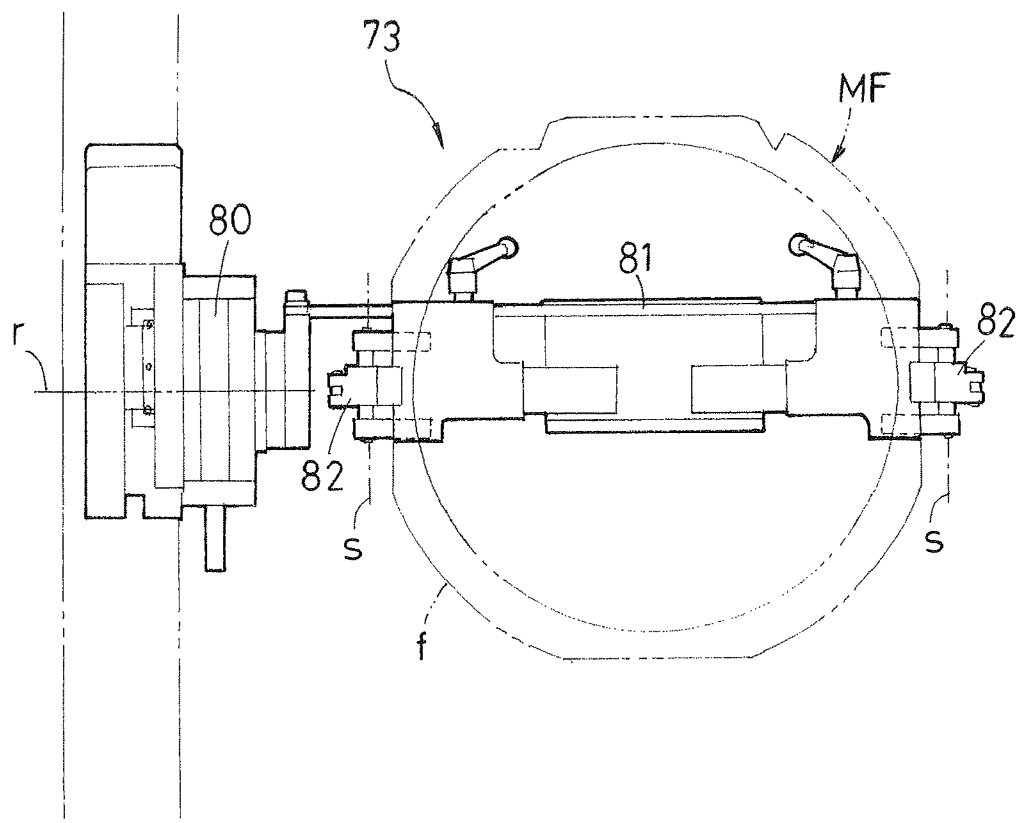
FIG. 16 is a plan view showing an inversion unit.
Figure 17:
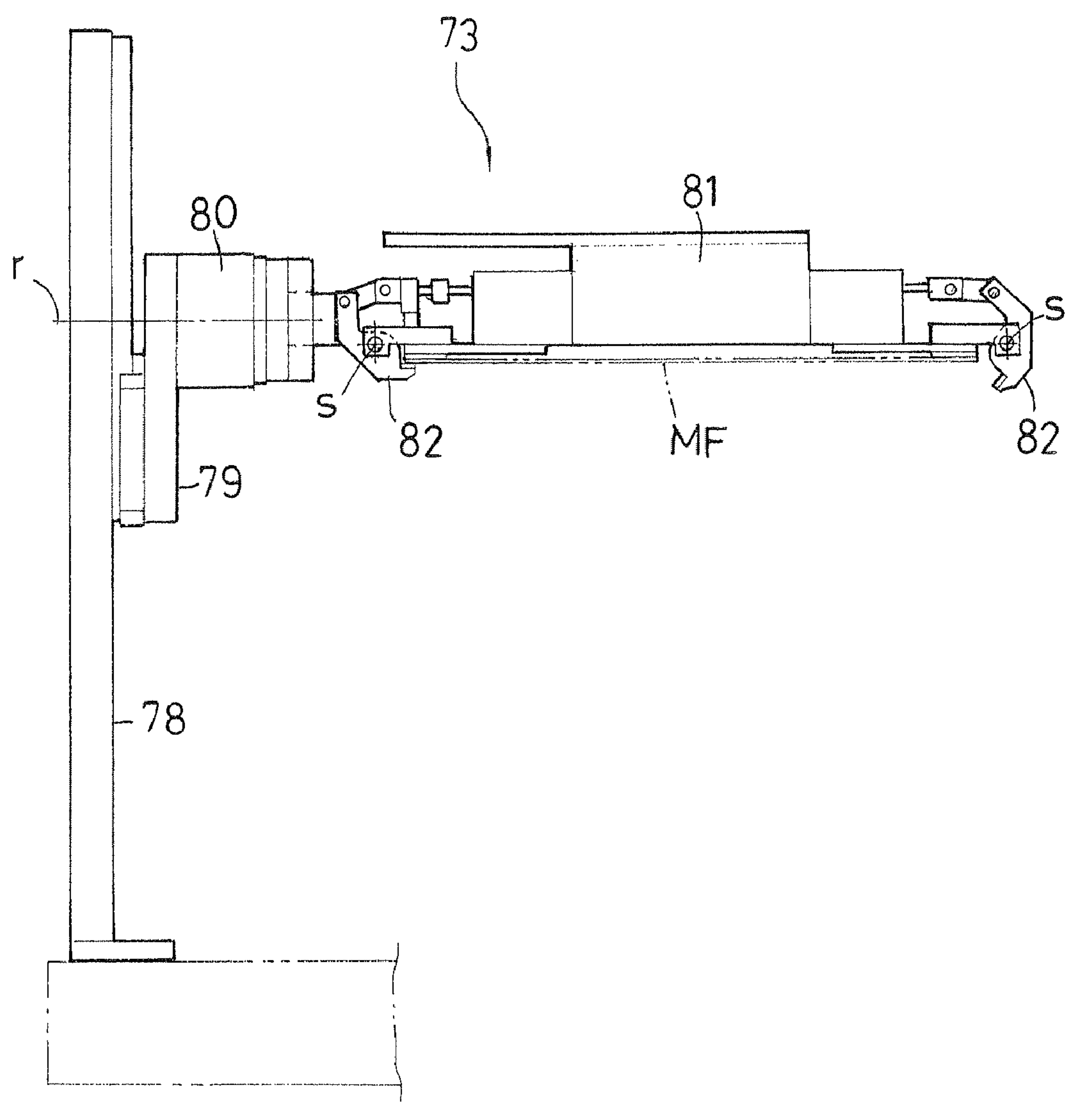
FIG. 17 is a front view showing the inversion unit.

As shown in FIGS. 16 and 17, the inversion unit 73 has the following configuration. That is, a receiving frame 81, which rotates about a horizontal axis r by means of a rotation actuator 80, is attached to an ascent/descent board 79, which moves vertically along a fixed upright rail 78, in a cantilever manner. Moreover, chuck claws 82 are provided at a distal end and a proximal end of the receiving frame 81, respectively, so as to rotate about an axis s.

The ring frame transport device 10 receives a mount frame MF from the holding table 7, and then places the mount frame MF on the mount frame holding table 77 of the mount frame transport device 72. In this case, the mount frame MF is placed on the mount frame holding table 77 so as to slightly protrude from the mount frame holding table 77.

Next, the inversion unit 73 located at an upper retreat position moves downward to a level of the mount frame holding table 77. Herein, the chuck claws 82 rotate downward, protrude from the mount frame holding table 77, and grasp diagonal corners of the mount frame MF. Thereafter, the inversion unit 73 moves upward while grasping the mount frame MF, and the receiving frame 81 rotates backward about the horizontal axis r. Thus, the mount frame MF is in such a position that the wafer W is directed upward.

The mount frame holding table 77 receives the mount frame MF having the top side directed upward again. Thereafter, the mount frame holding table 77 moves rearward to transport the mount frame MF to the tape separation unit 71.

Figure 24:
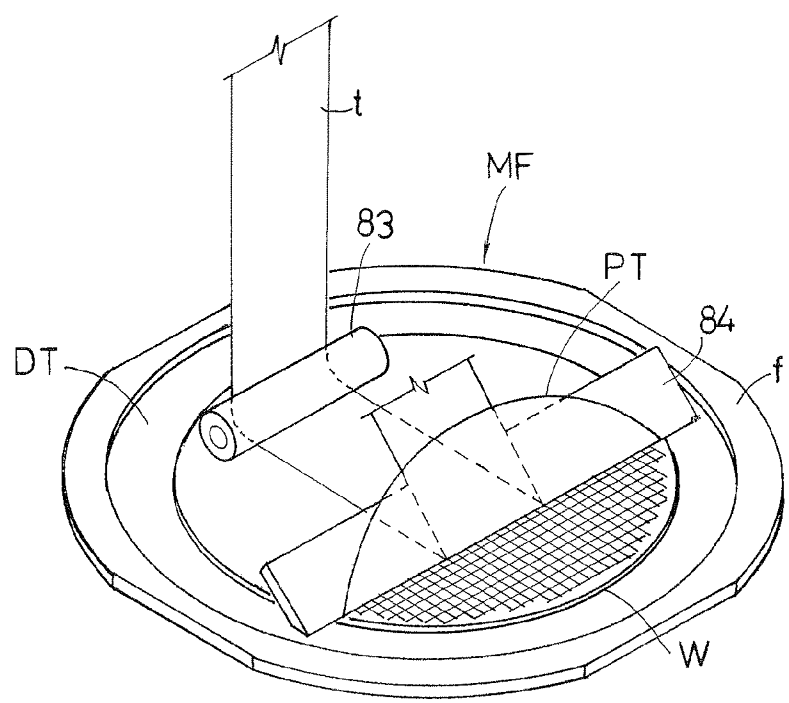
FIG. 24 is a perspective view showing a process of separating an adhesive tape.

As shown in FIG. 14, the tape separation unit 71 has the following configuration. That is, a guide roller 83 guides a narrow separation tape t in a roll form to a knife edge-shaped separation bar 84. At the separation bar 84, the separation tape t is folded and inverted. Thereafter, a reeling shaft 85 reels and collects the separation tape t. That is, the tape separation unit 71 joins the separation tape t to a protective tape PT joined to a front face of a wafer W in a mount frame MF which is placed on and suction-held by the mount frame holding table 77. Concurrently, the mount frame holding table 77 moves rightward in FIG. 14. As shown in FIG. 24, thus, the separation tape t is folded back at a tip end of the separation bar 84, so that the protective tape PT is separated together with the separation tape t from the surface of the wafer W. Herein, the adhesion of the protective tape PT is reduced in the previous process, that is, the ultraviolet irradiation process. Therefore, the protective tape PT is smoothly separated from the surface of the wafer W.

After the separation of the protective tape PT, the mount frame holding table 77 returns to its original position. At this position, the conveyance device 74 receives the mount frame MF from the mount frame holding table 77 and then transports the mount frame MF to the storage part 39.

Figure 18:
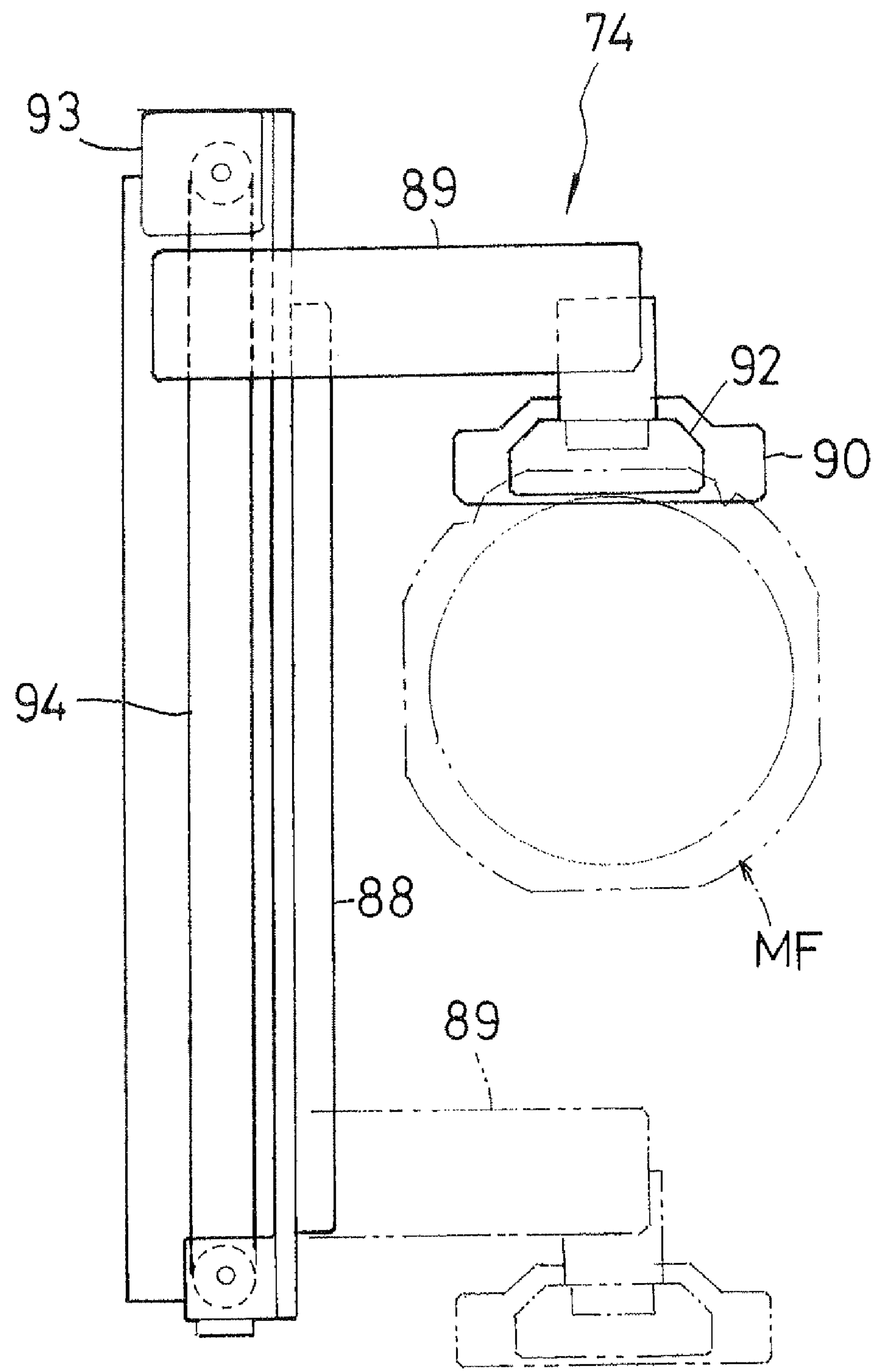
FIG. 18 is a plan view showing a conveyance device.
Figure 19:
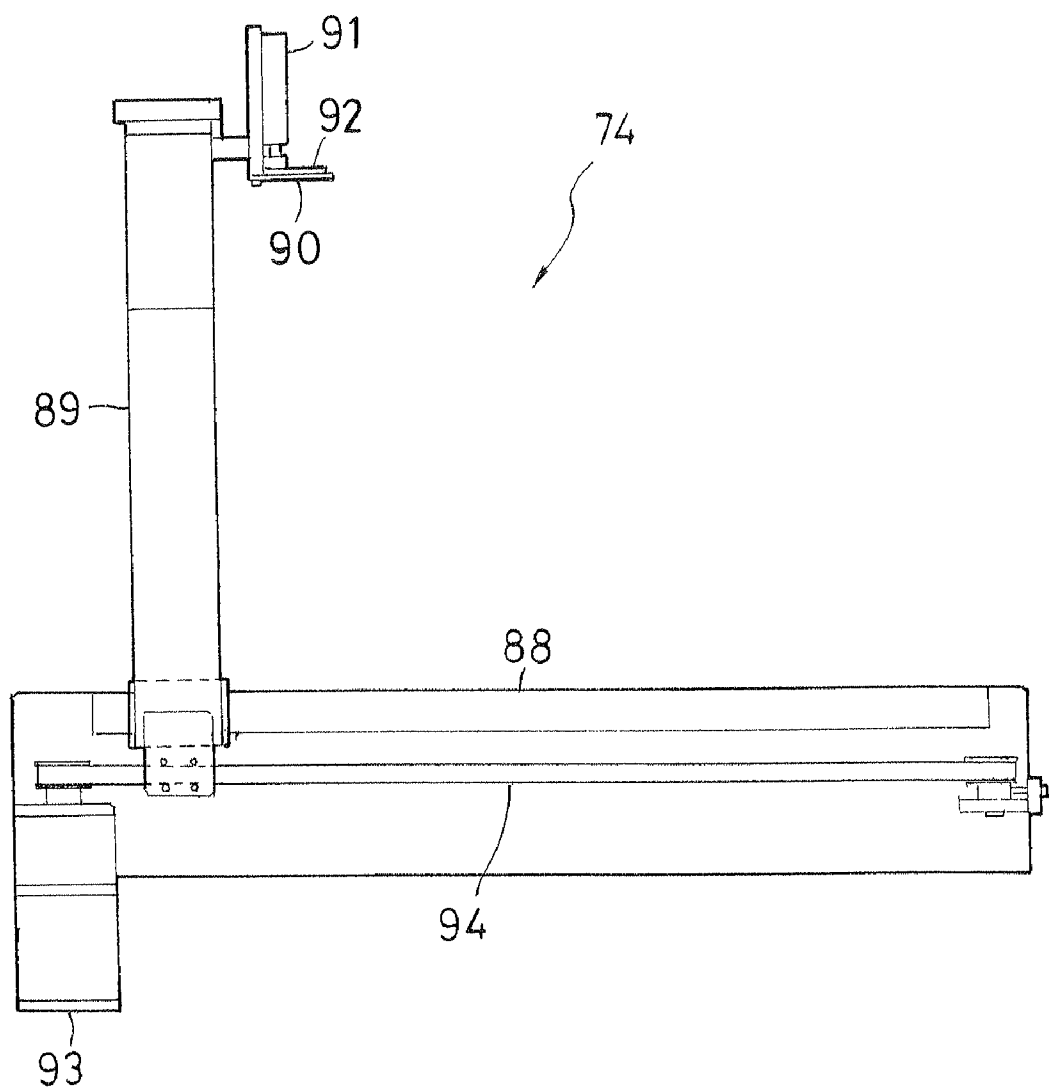
FIG. 19 is a side view showing the conveyance device.

As shown in FIGS. 18 and 19, the conveyance device 74 has the following configuration. That is, a chuck piece 92 is provided on a movable board 89 that moves horizontally in the front-to-rear direction along a guide rail 88, and is opened/closed by a fixed receiving piece 90 and a cylinder 91. Herein, one end of a mount frame MF is vertically held by the fixed receiving piece 90 and the chuck piece 92. Moreover, the movable board 89 has a bottom side coupled to a belt 94 moved rotationally by a motor 93. That is, when the motor 93 rotates forward/backward, the movable board 89 reciprocates in the front-to-rear direction.

Second Embodiment

Figure 20:
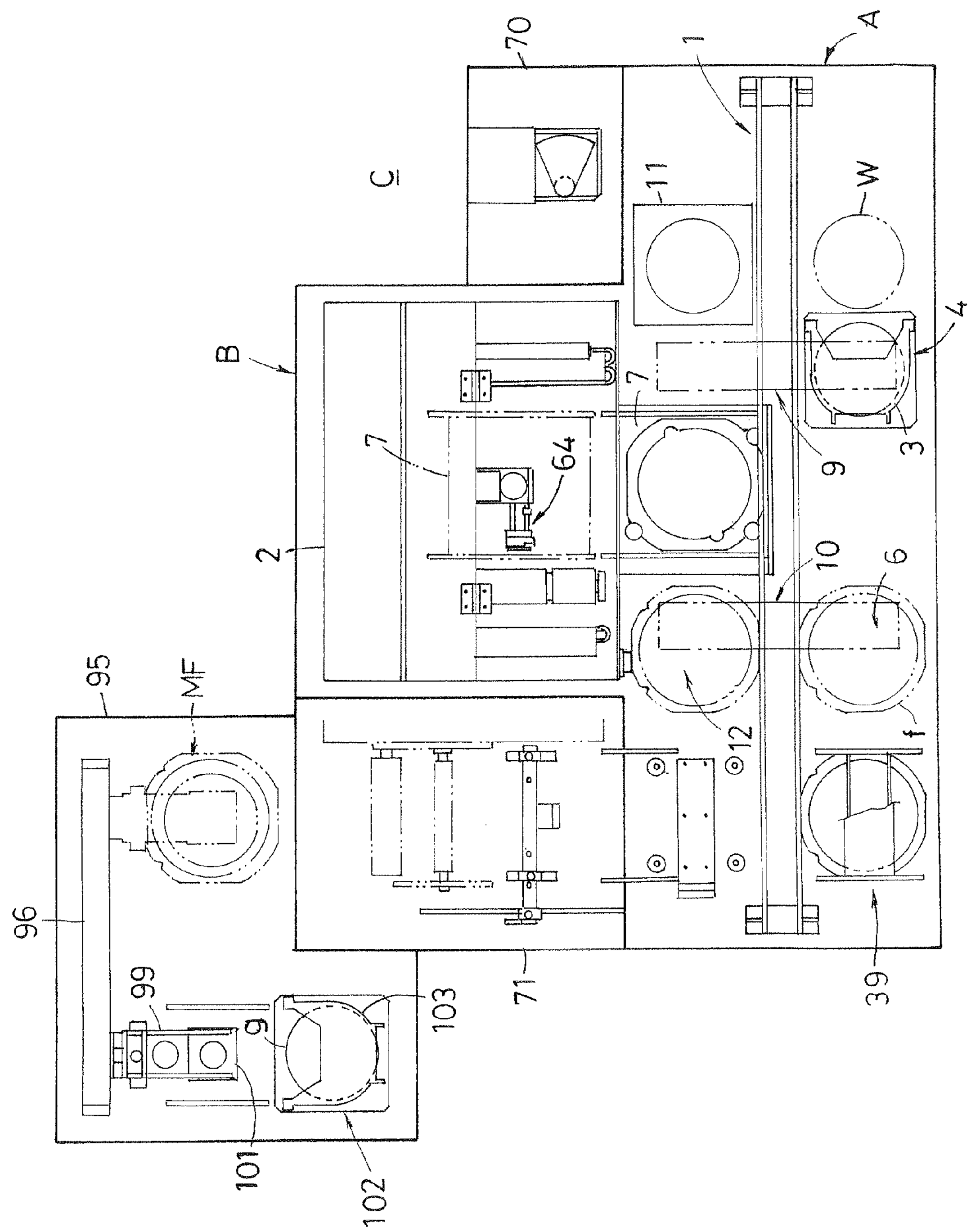
FIG. 20 is a plan view showing a second embodiment of the adhesive tape joining apparatus.
Figure 25:
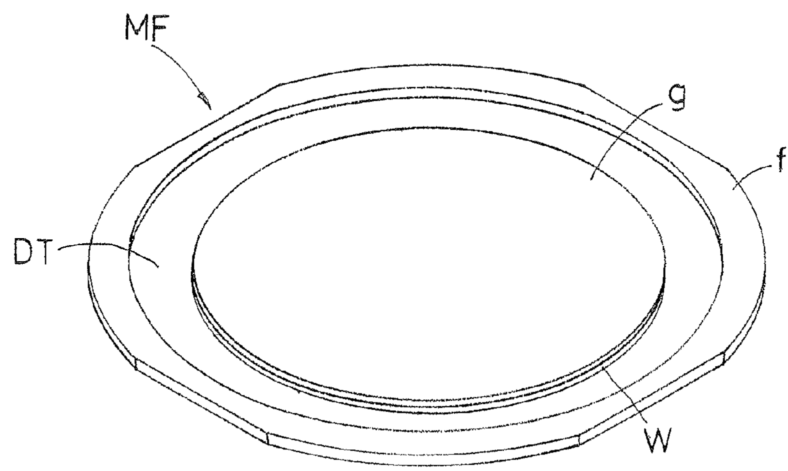
FIG. 25 is a perspective view showing a mount frame including an electronic substrate and a support substrate for reinforcing the electronic substrate.

FIG. 20 is a plan view showing a second embodiment of the adhesive tape joining apparatus. A wafer W to be used in this embodiment has a considerably thin thickness. As shown in FIG. 25, a support substrate g for reinforcement, such as a glass substrate, is joined to a surface of the wafer W through a double-coated adhesive tape (not shown). This double-coated adhesive tape to be used herein has a heat separation property. That is, when heat is applied to the double-coated adhesive tape, one of adhesion layers is foamed and expanded. The other adhesion layer is of an ultraviolet curable type. In this embodiment, the ultraviolet-ray irradiation unit 70 is disposed in the region C located at the right side of the protrusion section B in the base unit. Moreover, the tape separation unit 71 is disposed in the region D located at the left side of the protrusion section B. Further, a substrate separation unit 95 is disposed at a rear side of the tape separation unit 71. Herein, the substrate separation unit 95 is coupled to the tape separation unit 71 and, therefore, can be integrated with the base unit.

Figure 21:
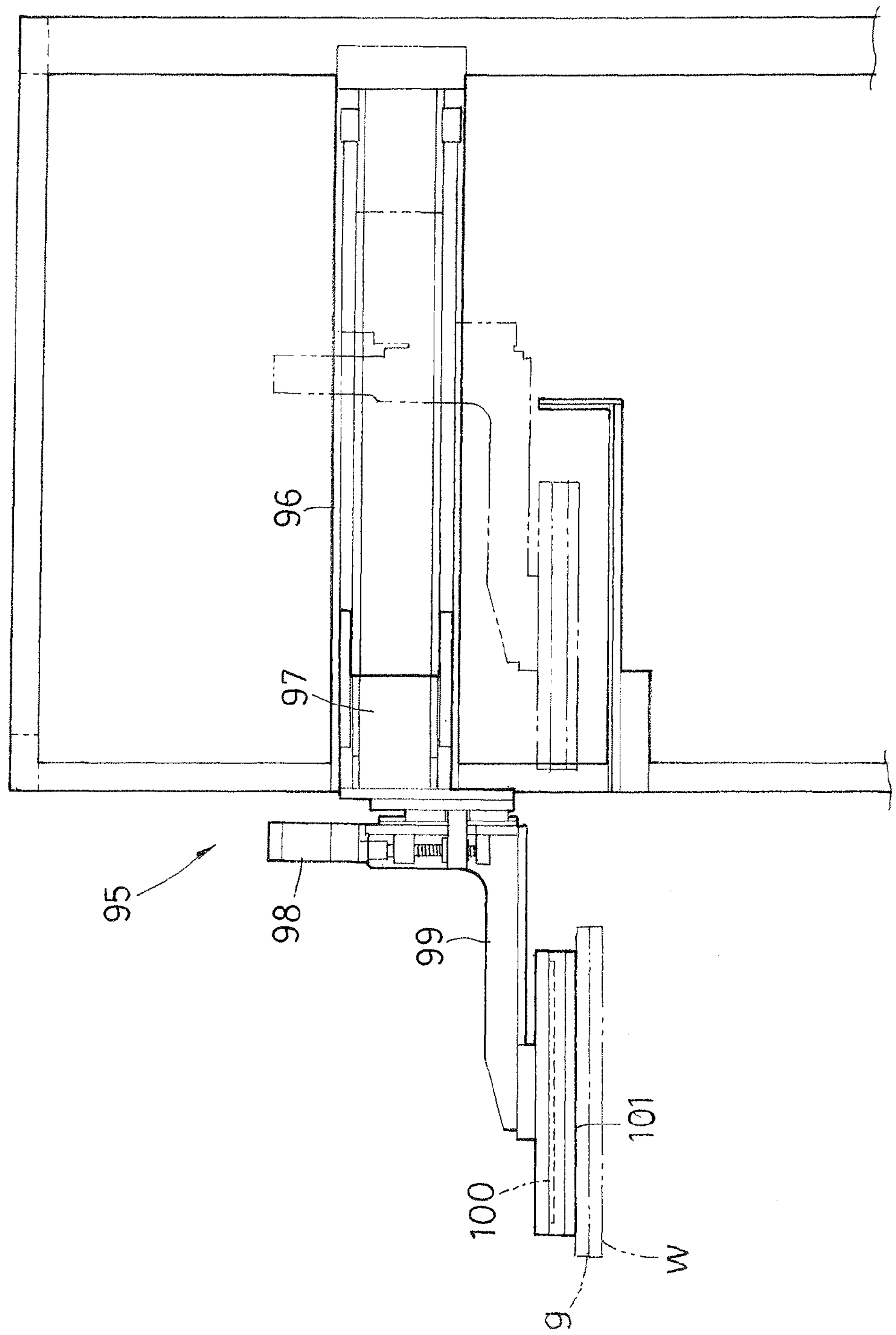
FIG. 21 is a side view showing a substrate separation unit.

As shown in FIG. 21, the substrate separation unit 95 has the following configuration. That is, an ascent/descent frame 99 is provided on a movable board 97 that moves in the left-to-right direction along a horizontally-supported guide rail 96. Herein, the ascent/descent frame 99 is driven by a motor 98 so as to move vertically in a screw feed manner. Moreover, a suction table 101 having a heater 100 embedded therein is provided at a bottom side of the ascent/descent frame 99, with a top side thereof being directed downward.

The suction table 101 is pressed against a surface of a wafer W (a support substrate g) in a mount frame MF which is transferred from the tape separation unit 71 while being directed upward. When the heater 100 of the suction table 101 applies heat to the support substrate g, a double-coated adhesive tape, which joins the support substrate g to the wafer W, is expanded, so that the adhesion of the double-coated adhesive tape is eliminated or is reduced considerably. Thereafter, the ascent/descent frame 99 moves upward in a state that the suction table 101 sucks the support substrate g. Thus, only the support substrate g is separated from the wafer W. This support substrate g is inserted into and collected by a cassette 103 of a collection part 102 disposed at a leftward front side of the substrate separation unit 95.

After the separation of the support substrate g, the mount frame MF is transferred to the tape separation unit 71. As described in the foregoing first embodiment, the double-coated adhesive tape left on the surface of the wafer W is separated from the surface of the wafer W through the separation tape t. Thereafter, the mount frame MF is collected by the storage part 39 in a state that the surface of the wafer W is bared.

Third Embodiment

Figure 22:
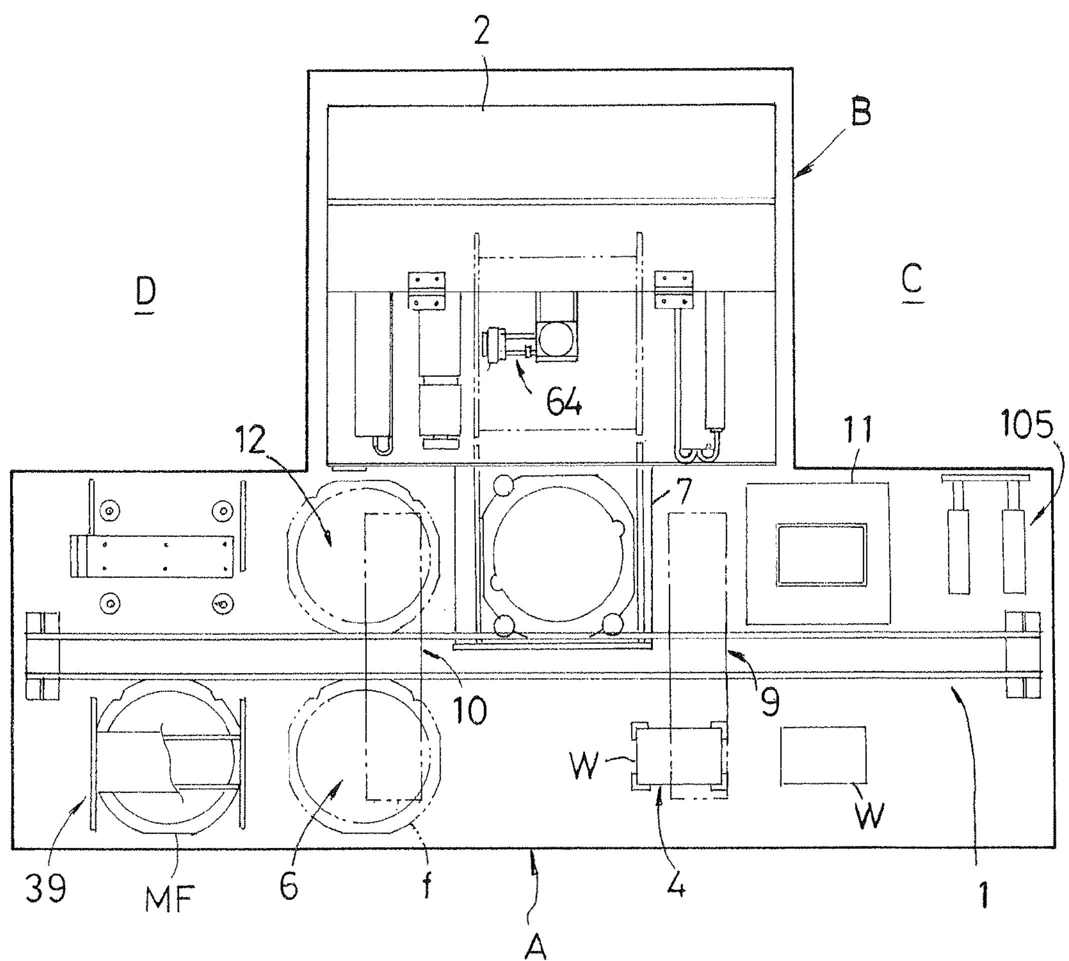
FIG. 22 is a plan view showing a third embodiment of the adhesive tape joining apparatus.

FIG. 22 is a plan view showing a third embodiment of the adhesive tape joining apparatus. A configuration to be described in this embodiment is almost similar to the basic configuration shown in FIG. 1 except that an electronic substrate W to be processed herein is a rectangular ceramic substrate which is used as a printed substrate and a liner separation unit 105 is disposed at a rightward rear side of the rectangular section A to separate a protective liner joined in advance to the surface of the electronic substrate. Herein, functional units and mechanisms identical with those in the basic configuration are denoted by identical numerals; therefore, description thereof will not be given.

When the electronic substrate supply part 4 supplies an electronic substrate W to the liner separation unit 105, the liner separation unit 105 separates a liner from a surface of the electronic substrate W. Thereafter, the aligner 11 performs alignment of the electronic substrate W, turns the electronic substrate W upside down, and transfers the electronic substrate W to the holding table 7. Concurrently, the ring frame supply part 6 supplies a ring frame f to the aligner 12, and then the aligner 12 performs alignment of the ring frame f and transfers the ring frame f to the holding table 7. When the holding table 7 moves to the tape joining position of the adhesive tape joining part 2, the adhesive tape joining part 2 joins an adhesive tape DT to the electronic substrate W, which is directed downward, and the ring frame f. Thereafter, the adhesive tape DT is cut along the ring frame f, so that a mount frame MF is fabricated. The mount frame MF which is directed downward is transported forward by the holding table 7 and then is collected by the storage part 39 in a state that the electronic substrate W is directed upward and is bared.

Figure 26:
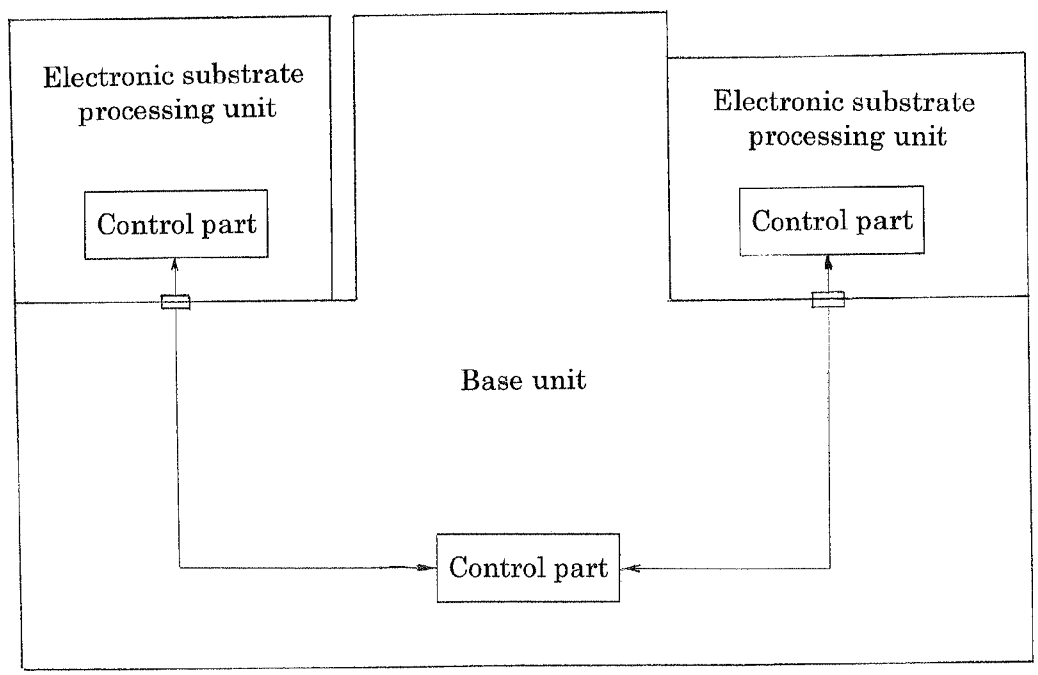
FIG. 26 is a schematic view showing a correlation among units with regard to control interlock.

In each of the first and second embodiments that the electronic board processing units are coupled to the base unit, as shown in FIG. 26, the base unit and each electronic substrate processing unit include control parts, respectively, in order that the respective units can be actuated independently of one another. When each electronic substrate processing unit is coupled to the base unit, the control part of the base unit is electrically connected to the control part of each electronic substrate processing unit to control the entire apparatus.

As described above, the transport mechanism 1 is disposed on the laterally-extending rectangular section A and the adhesive tape joining part 2 is disposed on the protrusion section B protruding rearward from the center of the rectangular section A. Thus, optional electronic substrate processing units such as the ultraviolet-ray irradiation unit 70 and the tape separation unit 71 can be disposed in the regions C and D located at the two sides of the protrusion section B, respectively, and can be coupled to the transport mechanism 1 and the adhesive tape joining part 2. That is, this apparatus can be reduced in installation area as compared with a conventional apparatus in which a series of processing units for executing processes for an electronic substrate are disposed on a rectangular base.

If one of the various electronic substrate processing units coupled to the base unit can not be used for a predetermined period of time due to a failure or a malfunction, the respective units are separated from one another and execute the processes for an electronic substrate separately. That is, the entire apparatus is not halted, leading to improvement in working efficiency.

In addition to the foregoing embodiments, the present invention may be embodied variously as follows.

(1) In the foregoing embodiments, preferably, the transport mechanism 1 and the adhesive tape joining part 2, which form the base unit, can be separated from each other. With this configuration, upon exchange of a roll of an adhesive tape DT with new one in the adhesive tape joining part 2, a user does not necessarily to conduct the exchange above the transport mechanism 1. That is, there is no possibility that the transport mechanism 1 is contaminated by dust generated in the exchange.

(2) In the first embodiment, the protective tape PT is of an ultraviolet curable type. Alternatively, the protective tape PT may be a protective tape which is readily separated from a wafer W without irradiation with the ultraviolet rays. For example, the protective tape PT may be of a pressure-sensitive adhesive tape. This case realizes a configuration that the ultraviolet-ray irradiation unit 70 is not disposed in the region C.

(3) The adhesive tape joining part 2 in each of the foregoing embodiments may utilize a precut tape rather than the strip-shaped adhesive tape DT. In this case, ring frame-shaped adhesive tapes DT attached to a strip-shaped base film at regular intervals are supplied to a tape joining position in succession. At the tape joining position, the base film is folded back by a knife edge of a separation member and, therefore, is separated from the adhesive tape DT. Then, a pressing roller or the like presses the adhesive tape DT against a ring frame f and an electronic substrate such as a wafer W. Thus, the adhesive tape DT is joined to the ring frame f and the electronic substrate.

The present invention may be embodied in other specific forms without departing from the spirit or essential attributes thereof and, accordingly, reference should be made to the appended claims, rather than to the foregoing specification, as indicating the scope of the invention.

What is claimed is:

1. An adhesive tape joining apparatus for joining an adhesive tape to a ring frame and an electronic substrate to hold the electronic substrate by the ring frame, the adhesive tape joining apparatus adopting an inverted "T"-shaped layout configured with a rectangular section that extends laterally when being viewed in a plane and a protrusion section that is coupled on a center of the rectangular section, the adhesive tape joining apparatus comprising:

an adhesive tape joining part that is disposed in the protrusion section and joins the adhesive tape to the ring frame and the electronic substrate; and a transport mechanism that is disposed in the rectangular section and transports the electronic substrate, the ring frame, and the electronic substrate held by the ring frame, wherein an electronic substrate processing unit is disposed in at least one of two regions adjoining to the rectangular section with the protrusion section being interposed therebetween, and is coupled to the transport mechanism.

2. The adhesive tape joining apparatus according to claim 1, further comprising a holding table that holds the electronic substrate and the ring frame at a position in the transport mechanism, and moves between this position and a tape joining position of the adhesive tape joining part, wherein the transport mechanism includes:

an electronic substrate supply part that supplies the electronic substrate to one of the regions with the adhesive tape joining part being interposed therebetween;

an aligner that performs alignment of the electronic substrate;

an electronic substrate transport device that transports the electronic substrate to the electronic substrate supply part, the aligner, the electronic substrate processing unit disposed in the region adjoining to the rectangular section and coupled to the transport mechanism, and the holding table;

a ring frame supply part that supplies the ring frame to the other region;

an aligner that performs alignment of the ring frame;

a storage part that houses the electronic substrate held by the ring frame; and a ring frame transport device that transports the ring frame to the ring frame supply part, the aligner, the holding table, the electronic substrate processing unit disposed in the region adjoining to the rectangular section and coupled to the transport mechanism, and the storage part.

3. The adhesive tape joining apparatus according to claim 2, wherein the electronic substrate has a surface to which a protective adhesive tape is joined, and the electronic substrate processing unit disposed in the region near the ring frame supply part is a tape separation unit that separates the protective adhesive tape from the surface of the electronic substrate held by the ring frame.

4. The adhesive tape joining apparatus according to claim 2, wherein the electronic substrate has a surface to which a protective adhesive tape of an ultraviolet curable type is joined, and the electronic substrate processing unit disposed in the region near the electronic substrate supply part is an ultraviolet-ray irradiation unit that irradiates the adhesive tape joined to the electronic substrate with ultraviolet rays.

5. The adhesive tape joining apparatus according to claim 1, wherein the electronic substrate is laminated on a support substrate through a double-coated adhesive tape with a base material thereof being sandwiched by different adhesion layers.

6. The adhesive tape joining apparatus according to claim 5, wherein at least one of the adhesion layers of the double-coated adhesive tape is of an ultraviolet curable type, and the electronic substrate processing unit disposed in the region near the electronic substrate supply part is an ultraviolet-ray irradiation unit that irradiates the double-coated adhesive tape with ultraviolet rays.

7. The adhesive tape joining apparatus according to claim 5, wherein the electronic substrate processing unit disposed in the region near the ring frame supply part is a substrate separation unit that separates the support substrate from the electronic substrate and collects the support substrate.

8. The adhesive tape joining apparatus according to claim 7, further comprising a tape separation unit that is coupled to the substrate separation unit and separates the double-coated adhesive tape, which is left on one of the electronic substrate and the support substrate.

9. The adhesive tape joining apparatus according to claim 1, wherein the adhesive tape joining part and the transport mechanism form a base unit, the base unit and each electronic substrate processing unit coupled to the base unit include control parts, respectively, so as to act the units independently of one another, and when each electronic substrate processing unit is coupled to the base unit or when another electronic substrate processing unit is coupled to the electronic substrate processing unit coupled to the base unit, the control part of the base unit is electrically connected to the control part of each electronic substrate processing unit to control the entire apparatus.

10. The adhesive tape joining apparatus according to claim 1, wherein the adhesive tape joining part disposed in the protrusion section and the transport mechanism disposed in the rectangular section are separated from each other.

* * * * *